(12) United States Patent
Park

(10) Patent No.: US 10,468,892 B2
(45) Date of Patent: Nov. 5, 2019

(54) BATTERY MANAGEMENT METHOD AND APPARATUS

(71) Applicant: Samsung Electronics Co., Ltd., Suwon-si (KR)

(72) Inventor: Jeonghyun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 220 days.

(21) Appl. No.: 15/278,547

(22) Filed: Sep. 28, 2016

(65) Prior Publication Data

US 2017/0126027 A1    May 4, 2017

(30) Foreign Application Priority Data

Nov. 2, 2015 (KR) .................. 10-2015-0153400

(51) Int. Cl.
*H02J 7/00*     (2006.01)
*G01R 31/371*   (2019.01)
*B60L 3/00*     (2019.01)
*G01R 31/382*   (2019.01)
*G01R 31/367*   (2019.01)
(Continued)

(52) U.S. Cl.
CPC .......... *H02J 7/0014* (2013.01); *B60L 3/0046* (2013.01); *B60L 58/10* (2019.02); *G01R 31/367* (2019.01); *G01R 31/371* (2019.01); *G01R 31/382* (2019.01); *G01R 31/392* (2019.01); *G01R 31/396* (2019.01); *H02J 7/0021* (2013.01); *H02J 7/0029* (2013.01); *B60L 2240/545* (2013.01); *B60L 2240/547* (2013.01); *B60L 2240/549* (2013.01); *H02J 7/0027* (2013.01);
(Continued)

(58) Field of Classification Search
CPC ... B60L 11/1866; H02J 7/0014; H02J 7/0021; H02J 7/0026; H02J 7/0029; G01R 31/367
USPC .................................................. 320/109, 134
See application file for complete search history.

(56) References Cited

U.S. PATENT DOCUMENTS 4,633,418 A   12/1986  Bishop
6,377,024 B1   4/2002  Choy
(Continued)

FOREIGN PATENT DOCUMENTS

JP        3237229 B2    10/2001
JP     2006-48945 A     2/2006
(Continued)

OTHER PUBLICATIONS

Extended European Search Report dated Mar. 16, 2017, in counterpart European Application No. 16196803.7 (7 pages, in English).

*Primary Examiner* — Paul Dinh
(74) *Attorney, Agent, or Firm* — NSIP Law

(57) ABSTRACT

Provided is a battery management method and apparatus. The battery management method includes acquiring physical quantity data, for each of a plurality of batteries, of when corresponding physical quantities of the plurality of batteries, making up the physical quantity data, dynamically vary, calculating unbalance data based on physical quantity difference information derived from the physical quantity data, calculating feature data for the physical quantity data by projecting the unbalance data to a feature space, and determining a battery safety for one or more of the plurality of batteries based on determined distribution information of the feature data.

24 Claims, 16 Drawing Sheets

(51) Int. Cl.
  *G01R 31/392*   (2019.01)
  *G01R 31/396*   (2019.01)
  *B60L 58/10*    (2019.01)

(52) U.S. Cl.
  CPC ........ *Y02T 10/7005* (2013.01); *Y02T 10/7055* (2013.01)

(56) References Cited

U.S. PATENT DOCUMENTS

| | | | |
|---|---|---|---|
| 8,198,862 B2 | 6/2012 | Zhang et al. | |
| 2005/0208368 A1* | 9/2005 | Nakamura | G01R 31/3662 |
| | | | 429/49 |
| 2007/0013347 A1* | 1/2007 | Kamohara | B60K 6/48 |
| | | | 320/160 |
| 2009/0088994 A1* | 4/2009 | Machiyama | H01M 10/48 |
| | | | 702/63 |
| 2009/0130542 A1* | 5/2009 | Mizoguchi | H01M 10/4207 |
| | | | 429/61 |
| 2009/0218986 A1* | 9/2009 | Jarvinen | B60L 11/185 |
| | | | 320/119 |
| 2010/0261048 A1* | 10/2010 | Kim | H01M 10/44 |
| | | | 429/150 |
| 2011/0148361 A1* | 6/2011 | Yokotani | H01M 10/482 |
| | | | 320/136 |
| 2011/0313613 A1* | 12/2011 | Kawahara | H01M 10/441 |
| | | | 701/34.4 |
| 2012/0004873 A1 | 1/2012 | Li | |
| 2012/0313439 A1* | 12/2012 | Yamaguchi | H01M 10/425 |
| | | | 307/71 |
| 2013/0106360 A1* | 5/2013 | Gaylo | H02J 7/0013 |
| | | | 320/134 |
| 2014/0278169 A1 | 9/2014 | Kim | |
| 2015/0028816 A1* | 1/2015 | Lee | H02J 7/0021 |
| | | | 320/134 |
| 2015/0369873 A1* | 12/2015 | Nakao | G01R 31/3648 |
| | | | 702/63 |
| 2016/0089994 A1* | 3/2016 | Keller | H02J 7/045 |
| | | | 320/153 |
| 2016/0214495 A1* | 7/2016 | Murata | B60L 58/27 |
| 2016/0336765 A1* | 11/2016 | Trimboli | H02J 7/0021 |
| 2017/0214256 A1* | 7/2017 | Hardy | H02J 7/0013 |

FOREIGN PATENT DOCUMENTS

| | | |
|---|---|---|
| JP | 4816743 B2 | 9/2011 |
| JP | 5286456 B1 | 6/2013 |
| JP | 2014-197542 A | 10/2014 |
| KR | 10-2013-0075379 A | 7/2013 |

* cited by examiner

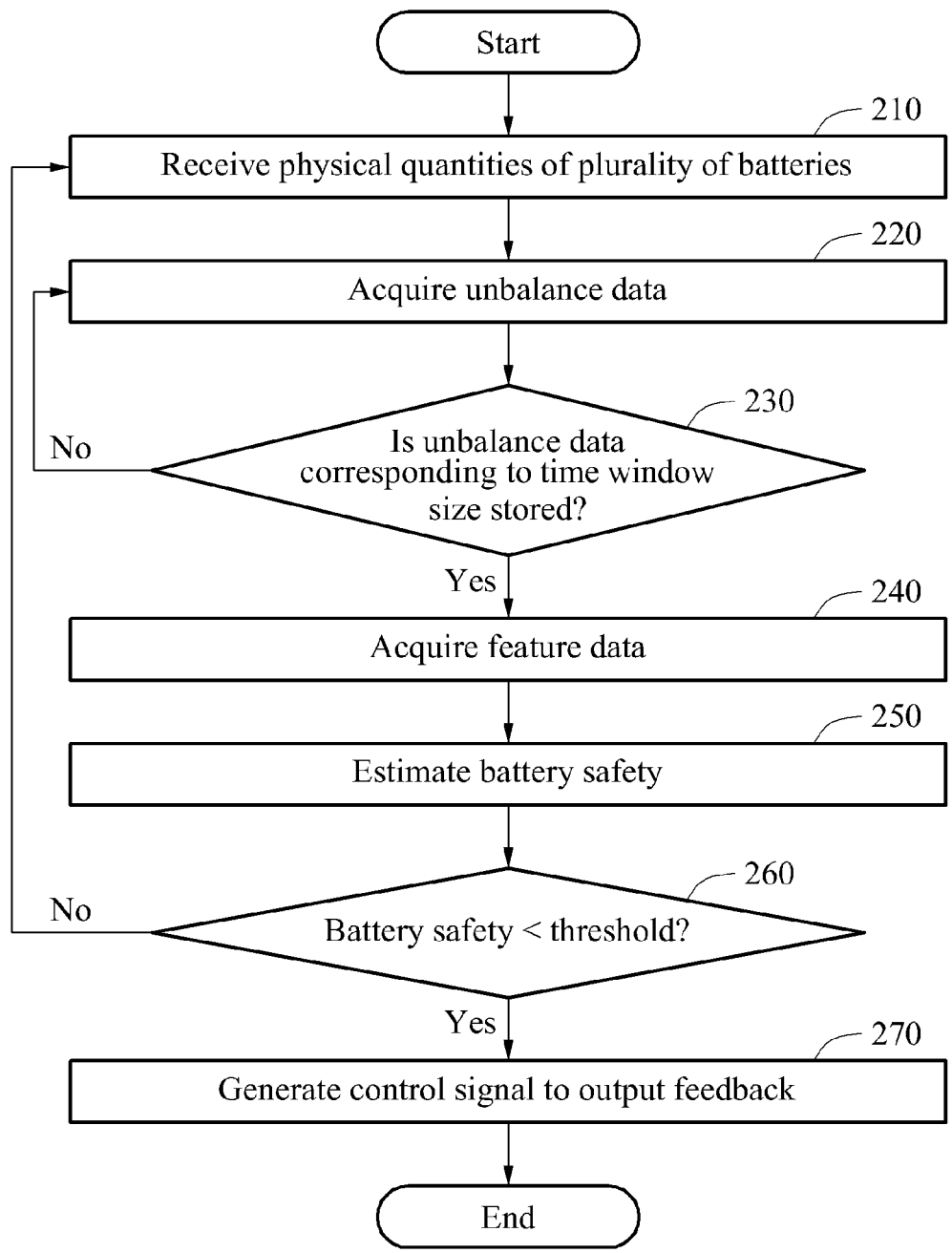

FIG. 7B
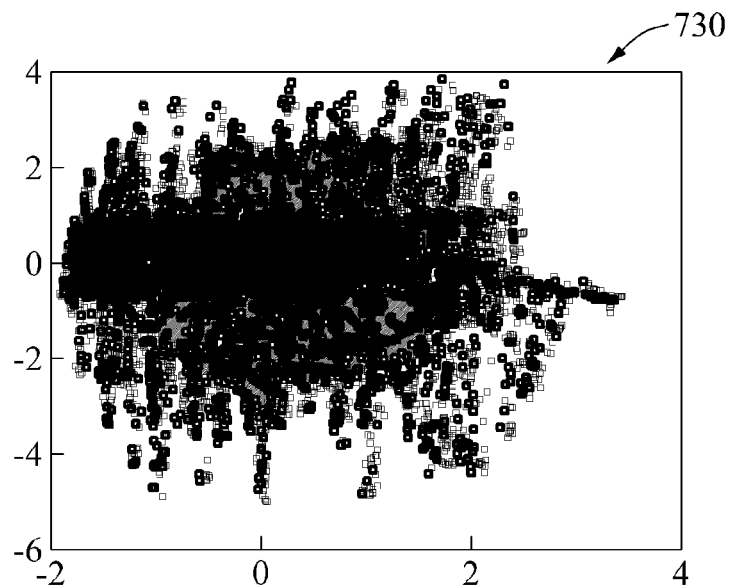
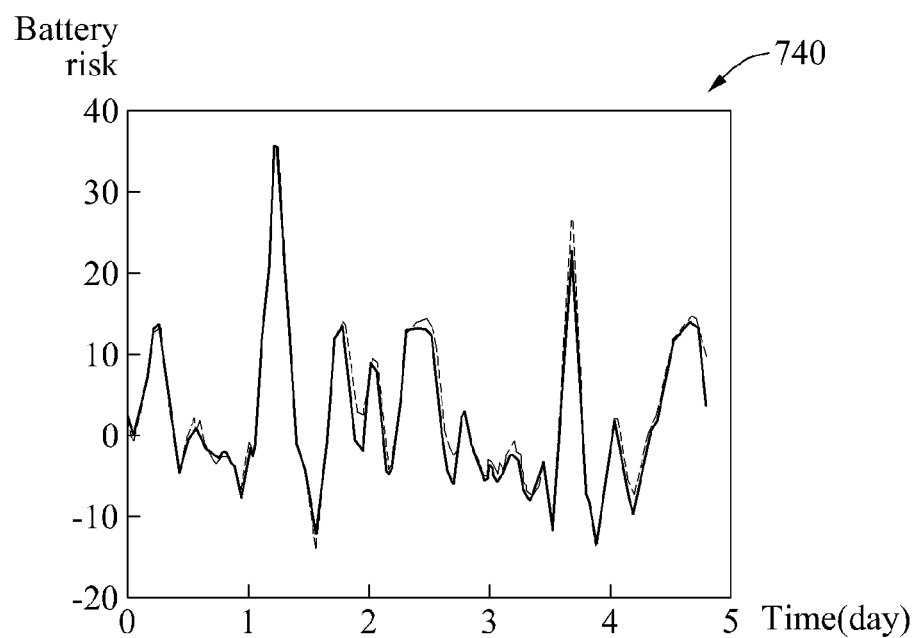

FIG. 7C
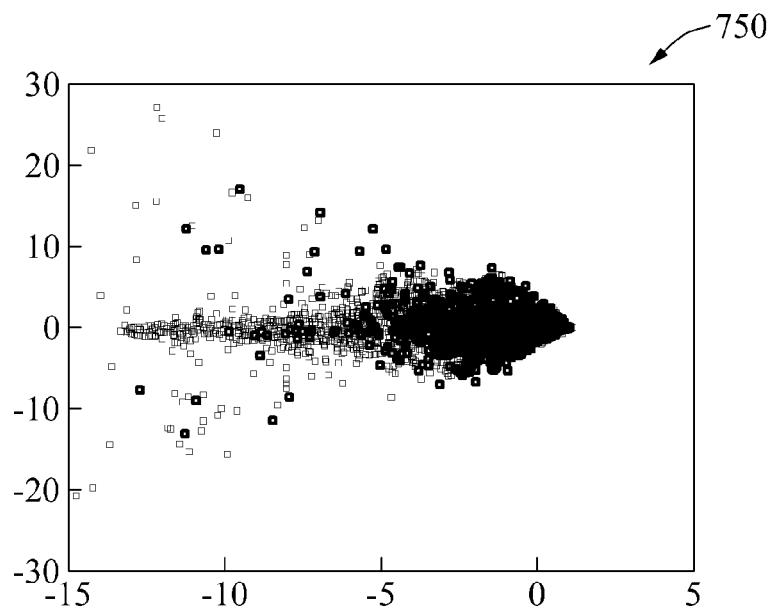
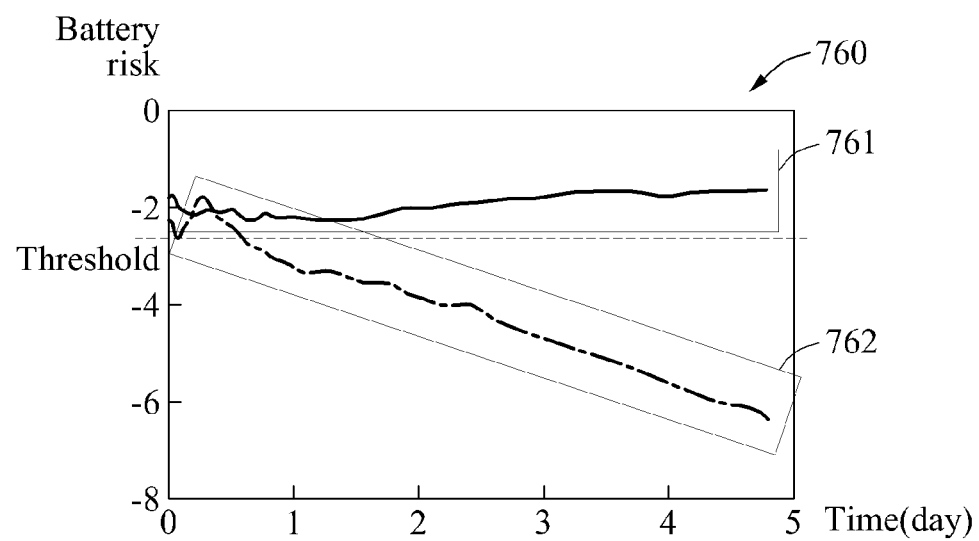

BATTERY MANAGEMENT METHOD AND APPARATUS

CROSS-REFERENCE TO RELATED APPLICATION(S)

This application claims the benefit under 35 USC 119(a) of Korean Patent Application No. 10-2015-0153400, filed on Nov. 2, 2015, in the Korean Intellectual Property Office, the entire disclosure of which is incorporated herein by reference for all purposes.

BACKGROUND

1. Field

The following description relates to battery management methods and apparatuses.

2. Description of Related Art

Recently, there has been an increasing use of devices equipped with batteries. Such batteries may be applied to mobility-based devices, for example, a smartphone, a laptop computer, and an electric vehicle. As the power consumption of the aforementioned devices increase, the capacity of the respective batteries used in such devices may also increase.

However, the increasing capacities of the batteries may lead to greater or more critical damage, such as in case of battery explosion, and thus there may be greater apprehension about the risks surrounding the increased capacity batteries. For example, in terms of a device being in close contact with an ear of a user such as the smartphone, even with a small explosion or failure the user may be seriously injured. Likewise, in terms of an electric vehicle, such battery explosions or failures while the vehicle is being operated may cause serious damage to the driver, the vehicle, and other properties, and which may also lead to depreciation in brand image of the relevant company.

SUMMARY

This Summary is provided to introduce a selection of concepts in a simplified form that are further described below in the Detailed Description. This Summary is not intended to identify key features or essential features of the claimed subject matter, nor is this Summary intended to be used as an aid in determining the scope of the claimed subject matter.

One or more embodiments include a non-transitory processor readable recording medium having recorded therein/on processor readable code to control one or more processing devices to implement a battery management method, the method including acquiring physical quantity data, for each of a plurality of batteries, of when corresponding physical quantities of the plurality of batteries, making up the physical quantity data, dynamically vary, calculating unbalance data based on physical quantity difference information derived from the physical quantity data, calculating feature data for the physical quantity data by projecting the unbalance data to a feature space, and determining a battery safety for one or more of the plurality of batteries based on determined distribution information of the feature data.

One or more embodiments provide a battery management method including acquiring physical quantity data, for each of a plurality of batteries, of when corresponding physical quantities of the plurality of batteries, making up the physical quantity data, dynamically vary, calculating unbalance data based on physical quantity difference information derived from the physical quantity data, calculating feature data for the physical quantity data by projecting the unbalance data to a feature space, and determining a battery safety for one or more of the plurality of batteries based on determined distribution information of the feature data.

The determining of the battery safety may include selectively indicating the battery safety to a user based on the determined distribution information.

The method may be performed by an electronic device apparatus, where the method may further include comparing the determined battery safety to one or more thresholds, and performing, based on a result of the comparing, one or more of alerting a user of the electronic device apparatus that a battery is in an abnormality state and rebalancing the plurality batteries.

The feature space may be based on a predetermined feature extraction model of balance data representing physical quantity difference information of physical quantity data of a battery being used when corresponding physical quantities dynamically vary without abnormality, and the distribution information of the feature data may be determined based on a predetermined distribution modeling of the balance data for battery risk or battery safety over time.

The electronic device apparatus may be an electric or hybrid-electric vehicle.

The determining of the battery safety may include determining whether a distribution of the feature data is within a predetermined normal area.

The normal area may be an area set using determined distribution information of normal feature data corresponding to balance data that that may be based on difference information of normal battery data.

The normal area may be an area of the feature space that is set based on a projection of the balance data into a feature space that results in the normal feature data.

The determining of the battery safety may include calculating probability data corresponding to the determined distribution data based on probability distribution information of normal feature data.

The determining of the battery safety may include calculating a distance between a distribution position corresponding to the determined distribution information and a reference point of a normal area corresponding to distribution of normal battery data.

The determining of the battery safety may further include performing a first comparing of the distance to a first threshold and, when a result of the first comparing indicates that the distance meets the first threshold, performing a second comparing of the distance to a second threshold, and performing cell balancing in response to the distance being determined to fail to meet the second threshold and generating a control signal to control an output a feedback to a user in response to the distance being determined to meet the second threshold.

The calculating of the feature data may include projecting the unbalance data to the feature space using a feature extraction model, where the feature extraction model may be a model previously defined so as to extract balance data from input data and be based on difference information of normal battery data.

The determining of the battery safety may include determining the distribution information using a feature distribution model that has been previously modeled based on distribution information of normal feature data corresponding to a normal feature extracted using the feature extraction model.

The method may further include comparing the battery safety to a threshold and generating a control signal to control an output of a feedback to a user based on a result of the comparing.

The method may further include performing a first comparing of the battery safety to a first threshold and, when a result of the first comparing indicates that the battery safety fails to meet the first threshold, performing a second comparing of the battery safety to a second threshold, and performing cell balancing in response to the battery safety being determined to meet the second threshold and generating a control signal to control an output of a feedback to a user in response to the battery safety being determined to fail to meet the second threshold.

The calculating of the unbalance data may include deriving the unbalance data based on the physical quantity difference information having an extent corresponding to a predetermined time window size, and storing the derived unbalance data in a buffer having a capacity corresponding to the predetermined time window size.

The calculating of the unbalance data may include deriving the unbalance data from first and second physical quantity difference information respectively calculated based on different first and second physical quantities, where the first and second physical quantities represent respective measurements of different physical properties of one or more of the plurality of batteries.

The unbalance data may include at least one of first difference information indicating respective first differences between an average value of the physical quantities and each of the physical quantities or indicates an average value of the respective first differences, second difference information indicating a second difference between a maximum value and a minimum value of the physical quantities, third difference information indicating respective third differences between the maximum value and each of the physical quantities or indicates an average value of the respective third differences, and fourth difference information indicating respective fourth differences between the minimum value and the each of the physical quantities or indicates an average value of the respective fourth differences.

The unbalance data may include at least one of the first difference information, second difference information, third difference information, and fourth difference information, for each of first physical quantities that are voltage measurements and second physical quantities that are temperature measurements.

The method may further include adding normalized values of the unbalance data corresponding to the first physical quantities to normalized values of the unbalance data corresponding to the second physical quantities, to determine an unbalance value for the plurality of batteries.

One or more embodiments may provide a battery management method including acquiring physical quantity data, for each of a plurality of batteries, of when corresponding physical quantities of the plurality of batteries, making up the physical quantity data, dynamically vary, calculating unbalance data based on physical quantity difference information derived from the physical quantity data, extracting feature data from the unbalance data using a feature extraction model, estimating a similarity between the extracted feature data and a feature distribution model modeled to define a normal area of a feature space in which the extracted feature data is distributed, and determining a battery state based on the estimated similarity.

The feature extraction model may be a model previously defined so as to extract a normal feature of balance data from input data and be based on difference information of normal battery data, and the feature distribution model may be a model generated based on distribution information of normal feature data corresponding to the normal feature extracted from the balance data using the feature extraction model.

The estimating may include calculating probability data corresponding to distribution information of the extracted feature data based on probability distribution information of the normal feature data.

The estimating may include calculating a distance between a distribution position corresponding to distribution information of the extracted feature data and a reference point of the normal area corresponding to distribution of normal battery data.

The estimating may include performing a first comparing of the distance to a first threshold and, when a result of the first comparing indicates that the distance meets the first threshold, performing a second comparing of the distance to a second threshold, and the determining of the battery state may include determining that cell balancing is to be performed in response to the distance being determined to fail to meet the second threshold and determining the battery state to be an abnormal state in response to the distance being determined to meet the second threshold.

The estimating may include performing a first comparing of a value corresponding to the similarity to a first threshold and, when a result of the first comparing indicates that the value fails to meet the first threshold, performing a second comparing of the value to a second threshold, and the determining of the battery state may include determining that cell balancing is to be performed in response to the value being determined to meet the second threshold and determining the battery state to be an abnormal state in response to the value being determined to fail to meet the second threshold.

The calculating of the unbalance data may include deriving the unbalance data based on the physical quantity difference information having an extent corresponding to a predetermined time window size, and the calculating of the unbalance data may further include storing the derived unbalance data in a buffer having a capacity corresponding to the predetermined time window size.

The calculating of the unbalance data may include deriving the unbalance data from first and second physical quantity difference information respectively calculated based on different first and second physical quantities, the first and second physical quantities representing respective measurements of different physical properties of one or more of the plurality of batteries.

One or more embodiments provide a battery management apparatus including an interface configured to acquire physical quantity data, for each of a plurality of batteries, of when corresponding physical quantities of the plurality of batteries, making up the physical quantity data, dynamically vary, and one or more processing devices configured to calculate unbalance data based on physical quantity difference information derived from the physical quantity data, calculate feature data for the physical quantity data by projecting the unbalance data to a feature space, and determining a battery safety for one or more of the plurality of batteries based on determined distribution information of the feature data.

The apparatus may further include the plurality of batteries and a plurality of sensors configured to measure the physical quantities from the plurality of batteries when the physical quantities of the plurality of batteries are dynamically varying and to provide the measured physical quantities to the interface for the acquiring of the physical quantity data.

The battery management apparatus may be an electric control unit (ECU), or in local communication with the ECU, of an electric or hybrid-electric vehicle that includes the plurality of batteries and a plurality of sensors configured to measure the physical quantities from the plurality of batteries when the physical quantities of the plurality of batteries are dynamically varying and to provide the measured physical quantities to the interface for the acquiring of the physical quantity data.

Other features and aspects will be apparent from the following detailed description, the drawings, and the claims.

BRIEF DESCRIPTION OF THE DRAWINGS

FIG. 2 illustrates an example of a battery management method.

FIGS. 7A through 7C illustrate examples of battery safeties of a first battery and a second battery.

Figure 1A:
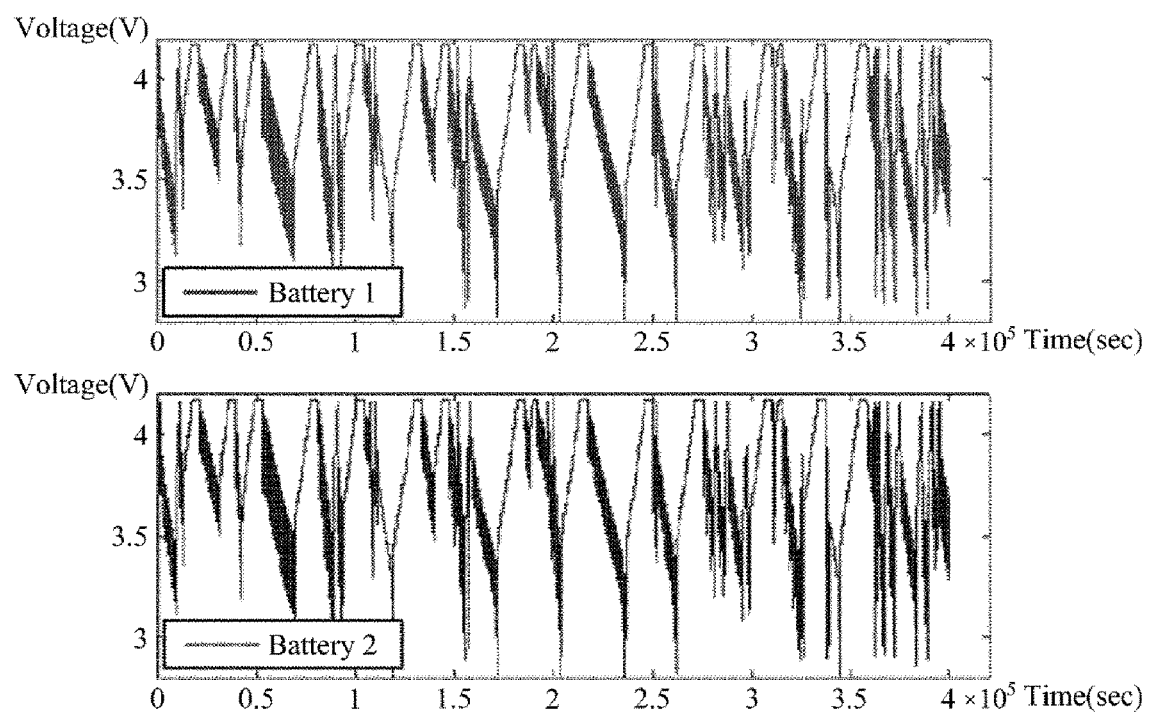
FIGS. 1A and 1B illustrate respective examples of physical quantities and physical quantity differences for two example batteries.

Throughout the drawings and the detailed description, unless otherwise described or provided, the same drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, after an understanding of the present disclosure, various changes, modifications, and equivalents of the methods, apparatuses, and/or systems described herein will be apparent to one of ordinary skill in the art. The sequences of operations described herein are merely non-limiting examples, and thus are not limited to those set forth herein, but may be changed as will be apparent to one of ordinary skill in the art, with the exception of operations necessarily occurring in a certain order, after an understanding of the present disclosure. Also, descriptions of operations and constructions that may be understood, after an understanding of differing aspects of the present disclosure, may be omitted in some descriptions for increased clarity and conciseness.

Terms used herein are to merely explain specific embodiments, thus they are not meant to be limiting. A singular expression includes a plural expression except when two expressions are contextually different from each other. For example, as used herein, the singular forms "a", "an", and "the" are intended to include the plural forms as well, unless the context clearly indicates otherwise. Herein, a term "include" or "have" are also intended to indicate that characteristics, figures, operations, components, or elements disclosed on the specification or combinations thereof exist. The term "include" or "have" should be understood so as not to pre-exclude existence of one or more other characteristics, figures, operations, components, elements or combinations thereof or additional possibility. In addition, though terms such as first, second, A, B, (a), (b), and the like may be used herein to describe components, unless indicated otherwise, these terminologies are not used to define an essence, order, or sequence of a corresponding component but used merely to distinguish the corresponding component from other component(s). Furthermore, any recitation of ranges of values herein are merely intended to serve as a shorthand method of referring individually to each separate value falling within the range, unless otherwise indicated herein, and each separate value is incorporated into the specification as if it were individually recited herein.

In addition, unless otherwise defined, all terms including technical and scientific terms used herein have the same meaning as commonly understood by one of ordinary skill in the art to which respective embodiments belong. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

Various alterations and modifications may be made to embodiments, some of which will be illustrated in detail in the drawings and detailed description. However, it should be understood that these embodiments are not construed as limited to the disclosure and illustrated forms and should be understood to include all changes, equivalents, and alternatives within the idea and the technical scope of this disclosure. Examples described herein have been provided so that this disclosure will be thorough, and will convey a scope of the disclosure to one of ordinary skill in the art.

Hereinafter, further reference will be made in detail to embodiments with reference to the accompanying drawings, wherein like reference numerals refer to like elements throughout.

Figure 1B:
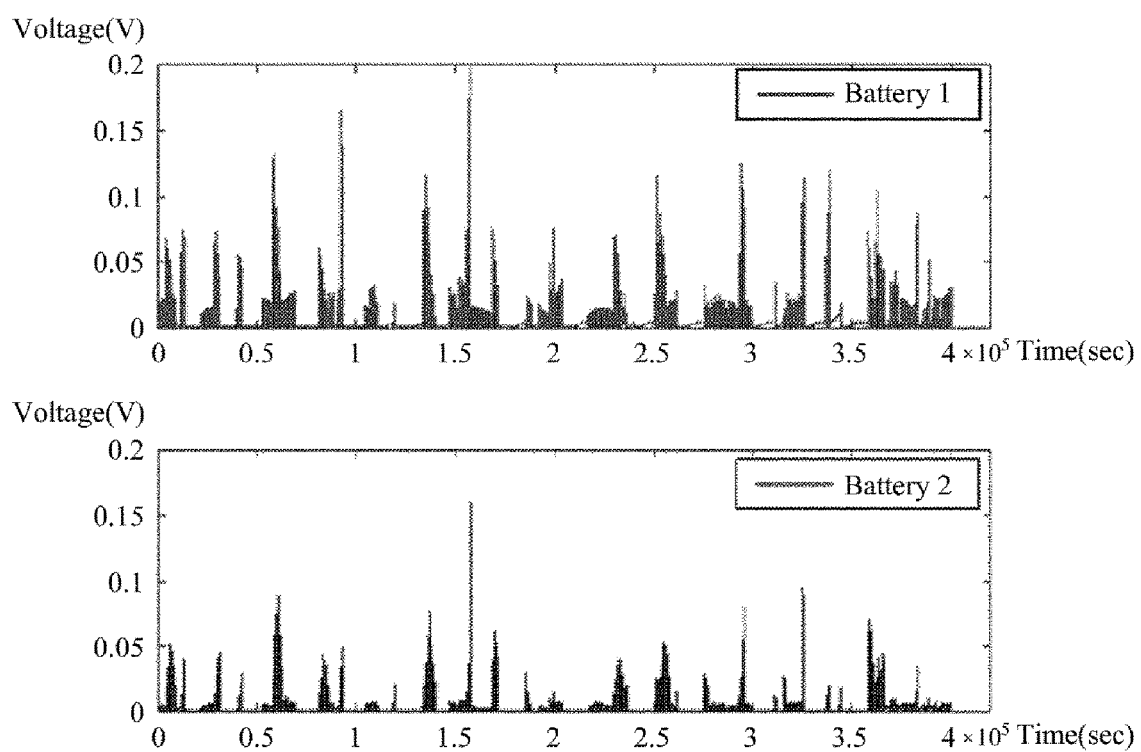

FIGS. 1A and 1B illustrate respective examples of physical quantities and physical quantity differences for two example batteries, according to one or more embodiments.

A battery is, for example, a battery module or a battery cell. Thus, a plurality of batteries may represent a plurality of battery modules or battery cells. As respective batteries, each of the modules may include a single battery cell or a plurality of battery cells, in which case the plurality of battery cells may be connected to one another in series or parallel. In an embodiment, the plurality of modules may be connected in series, for example, as a battery pack.

Herein, the term physical quantities of a plurality of batteries refers to, for example, a voltage, a current, and/or a temperature, each representing a different physical quantity, of each battery, battery cell, and/or battery module, or any combination of the same.

FIG. 1A illustrates respective measured voltages of two example batteries, i.e., Battery 1 and Battery 2. The respective voltages of Batteries 1 and 2 dynamically vary due to their being in use, such as through charging and/or discharging of Battery 1 and Battery 2.

FIG. 1B illustrates example respective physical quantity differences for each of Battery 1 and Battery 2 based on measured voltages, for example. The respective physical quantity differences indicate a deviation for each of Battery 1 and Battery 2. For example, when a voltage value of Battery 1 is $V_1$, a voltage value of Battery 2 is $V_2$, and an average of $V_1$ and $V_2$ is $V_{average}$ at a time t, the physical quantity difference for Battery 1 may be $V_1-V_{average}$, and the physical quantity difference for Battery 2 may be $V_2-V_{average}$, at the time t. The illustrated respective physical quantity differences for each of Battery 1 and Battery 2 in FIG. 1B do not correspond to a change pattern, and thus, it is may be difficult to determine each battery's state using only one threshold, i.e., by comparing the physical quantity differences to a particular threshold. Due to these physical quantity differences not corresponding to the change pattern, it is also difficult to set a constant that could be used to determine each battery's state. Still further, if physical quantity differences are only determined when the voltages are not dynamically varying, such as immediately before a starting of an electric vehicle, and the result of those differences compared to a threshold, this determination may not be sufficiently accurate because the determination of an abnormality does not take into consideration how the batteries respond during use, which may be more accurate of the risk of abnormality. Additionally, as each physical quantity difference has a value less than the corresponding physical quantity, the respectively determined physical quantity differences are susceptible to sensor or measurement errors. For example, in the illustrated examples of FIG. 1B, the physical quantity differences have values ranging between 0 and 0.2 volts (V). Thus, with such a limited consideration of each respective physical quantity difference to a particular threshold and susceptibility of errors in such physical quantity difference determinations, the probability that the respectively determined battery state is incorrectly determined may be relatively high, which may lead to incorrect battery state determinations. In addition, if physical quantity differences are only considered when the batteries are not in use, i.e., without the dynamic varying of the physical quantities, then battery abnormality determination may also be less reliable.

FIG. 2 illustrates a battery management method, according to one or more embodiments. Battery management methods herein are implemented by hardware. For example, the battery management method of FIG. 2 may be performed by a battery management apparatus, such as any of the battery management apparatuses discussed herein, as only examples. Such battery management apparatuses include one or more processing devices, such as one or more processors, and include one or more memories. For example, in one or more embodiments, one or more processing devices may be controlled to implement one or more of the battery management methods discussed herein, as only examples, upon execution or implementation of processor or computer readable code recorded in or on such memory or another non-transitory recording medium. Additionally, in one or more embodiments, one or more processing devices may be specially or particularly configured or controlled to implement one or more of the battery management methods discussed herein, as only examples, through reference to such one or more memories that record sensed or measured physical properties for one or more batteries, battery cells, or battery modules for a period of time, for example, as well as one or more feature extraction and/or feature distribution models, for example, that may have been pre-learned based on normal training data, for example, and which may be updated or take into consideration driving patterns of the user in an electric vehicle embodiment. Accordingly, though method operations for differing embodiments will be discussed below through reference to operations of a battery management apparatus, such as by any or all of the described battery management apparatuses discussed herein, this reference to the battery management apparatus is for convenience of explanation and should not be inferred as meaning that the described operations must be implemented by a particularly described battery management apparatus according to one or more embodiments, but, rather, is available for alternative implementations as well.

Referring to FIG. 2, in operation 210, the example battery management apparatus may receive physical quantities regarding a plurality of batteries. Here, as noted above, a battery herein is, for example, a battery cell or a battery module. The physical quantities of the plurality of batteries are measured or sensed by a sensing system that includes one or more sensors for each of plural batteries. Depending on embodiment, the battery management apparatus may include the sensing system, as well as the batteries. The sensors may also be included in each battery as originally manufactured, for example, or configured to be added after manufacture. The sensing system is configured to transfer the measured or sensed physical quantities to the battery management apparatus or another component of the battery management apparatus. As an example, the sensing system may collect voltage data, current data, and/or temperature data, each a different physical quantity, of or from each of multiple or all batteries at preset intervals of time, for example, at intervals of one second, and transfer the collected voltage data, the current data, and/or the temperature data to the battery management apparatus. The preset intervals may be the same for all batteries or physical quantities, or they may be varied, and the sensing system may store the collected data until preset time(s) and/or until the respective data is requested by the battery management apparatus, or the sensing system may transfer the collected data to the battery management apparatus immediately upon measurement, for example.

The sensed physical quantities may be expected to vary dynamically. In addition, depending on application, the sensed physical quantities may have expected different patterns. For example, when a plurality of batteries are used for a particular physical application, for example, an electric moving body or vehicle, where the plurality of batteries are charged and discharged, the corresponding physical quantities will respectively represent charging and discharging patterns.

The battery management apparatus stores the physical quantities in a buffer, representing one or more memories of the battery management apparatus for example, having a size corresponding to a time window size, e.g., a size sufficient or designed to store received physical quantity data for a corresponding window of time. When the physical quantities are stored in the buffer, the battery management apparatus accesses the buffer. For example, when all transferred physical quantities for the window of time have been stored in the buffer the battery management apparatus may be set to implement further operations, such as those of operation 220, based on the stored physical quantity data or such operations may be implemented in real time upon receipt of the transferred physical quantity data.

For example, in operation 220, the battery management apparatus acquires, e.g., calculates or derives, unbalance data using physical quantity difference information calculated based on the physical quantities of the plurality of batteries stored in the buffer. In an example, the battery management apparatus calculates first physical quantity difference information based on first physical quantities of the plurality of batteries, and derives the unbalance data using the first physical quantity difference information.

As an example, the battery management apparatus calculates $V_{average}$, an average of respective voltage data $V_1$ through $V_n$ of n battery cells, and calculates first voltage difference information between $V_{average}$ and each of $V_1$ through $V_n$ for the first physical quantity, i.e., voltage. Here, in this example, n items of first voltage difference information are calculated, as the unbalance data. In one or more embodiments, when a calculation result is a negative value, an absolute value is to be applied to the calculated result. Also, the battery management apparatus may calculate a standard deviation, a distribution, and/or an average of the n items of first voltage difference information, for example, as the unbalance data. Also, the battery management apparatus may calculate a standard deviation, a distribution, and/or an average of absolute values of the n items of first voltage difference information, for example, as the unbalance data.

As another example, the battery management apparatus may determine a maximum value, for example, $V_{max}$ and a minimum value, for example, $V_{min}$ among $V_1$ through $V_n$, and calculate second voltage difference information between $V_{max}$ and $V_{min}$, for example, as the unbalance data.

As still another example the battery management apparatus calculates third voltage difference information between $V_{max}$ and each of $V_1$ through $V_n$, e.g., though the difference information between $V_{max}$ and V corresponding $V_{min}$ may already have been calculated when the second voltage difference information is also calculated, and calculates fourth voltage difference information between $V_{min}$ and each of $V_1$ through $V_n$, e.g., though the difference information between $V_{min}$ and V corresponding $V_{max}$ may already have been calculated when the second voltage difference information is also calculated. Here, n items of the third voltage difference information may be calculated and/or n items of fourth voltage difference information may be calculated, as the unbalance data. Also, the battery management apparatus may calculate a standard deviation, a distribution, and/or an average of the n items of third voltage difference information, or a standard deviation, a distribution, and/or an average of absolute values of the n items of third voltage difference information, as the unbalance data. Also, the battery management apparatus may calculate a standard deviation, a distribution, and/or an average of the n items of fourth voltage difference information, or a standard deviation, a distribution, and/or an average of absolute values of the n items of fourth voltage difference information, as the unbalance data.

Although the foregoing descriptions are provided based on the unbalance data being derived from calculated physical quantity difference information or through particular calculated physical quantity difference information, this is only as an example, as derivation of the unbalance data is not limited thereto.

In an example, the battery management apparatus may calculate physical quantity difference information based on second physical quantities of the plurality of batteries, and derive unbalance data based on the calculated physical quantity difference information for the second physical quantities or based on both the aforementioned physical quantity difference information for the first physical quantities and the physical quantity difference information for the second physical quantities, as the unbalance data. Here, the second physical quantities have properties differing from properties of the first physical quantities. For example, the second physical quantities may represent respectively measured temperatures of the batteries, information of which is transferred to the battery management apparatus by the sensor system. Thus, the battery management apparatus may calculate temperature difference information based on the measured temperature data of a plurality of battery cells that is stored in the buffer. The battery management apparatus may calculate the temperature difference information in the same way any, or any combination, of the first voltage difference information through the fourth voltage difference information was calculated above. For example, in an embodiment, the battery management apparatus derives unbalance data based on the voltage difference information and the temperature difference information. For example, when the battery management apparatus normalizes the voltage difference information and the temperature information, and derives unbalance data by combining the normalized voltage difference information and temperature difference information, the result may be considered an unbalance value. Additionally, or alternatively, another physical quantity may also be considered.

The battery management apparatus stores the derived unbalance data in a buffer of the battery management apparatus, such as the buffer storing the transferred physical quantity data or another buffer. In operation 230, the battery management apparatus may determine whether an amount of the unbalance data stored in the buffer corresponds to a time window size. The time window size may correspond to an amount of unbalance data stored in the buffer and/or capacity of the buffer that corresponds to a set window or period of time. In addition, the battery management apparatus may determine whether a size or amount of the stored unbalance data corresponds to, or nears, a set or limiting capacity size of the buffer. When the amount of unbalance data stored in the buffer does not correspond to the time window size, the battery management apparatus may derive additional unbalance data and store the additional unbalance data in the buffer. When the buffer is determined to have filled to a capacity, as only an example, the battery management apparatus may access the buffer and retrieve the unbalance data from the buffer for or during a next operation, such as operation 240.

In operation 240, the battery management apparatus acquires, e.g., calculates or derives, feature data by projecting the retrieved unbalance data to a set feature space. In an example, the battery management apparatus projects the feature data to the feature space using a feature extraction model. Through this, the feature data may be distributed or represented in the particular feature space that is dependent on the feature extraction model.

The feature extraction model is, for example, a model previously defined or pre-taught, e.g., from training difference information before determination of the safety or abnormality of the battery based on the sensed physical quantities, to extract a feature of balance data, i.e., data representing a normal operation of the battery. For example, the balance data may be pre-taught or derived based on derived or provided difference information of normal battery data or battery data of a normally operating battery, such as based on a discharging use pattern of the normal battery. The normal battery data may be used, available for, or include battery data for various use patterns that such a normal battery (or the particular battery for which the physical quantity data is being provided) may experience after production, and may indicate history data of such a normally operating battery, the particular battery, or a simulated normally operating battery, in which one or more abnormalities, for example, an over-charge, an over-discharge, a thermal runaway, an explosion, a contact error, and a power reduction, do not occur, for example. Thus, in such an example, the normal battery data may not include abnormality representing data. Such a feature extraction model will be further described below with reference to FIG. 3.

In operation 250, the battery management apparatus estimates a battery safety based on distribution information of the calculated feature data in the feature space. The battery management apparatus may, thus, determine the distribution information of the feature data using a feature distribution model, for example.

The feature distribution model is also modeled in advance of a determination of the safety or abnormality of the battery based on the sensed physical quantities. For example, normal feature data corresponding to a corresponding feature of the balance data may be obtained or acquired, e.g., calculated or derived, in advance during a manufacturing process of the battery management apparatus, during manufacture of the underlying application embodiment that includes such a battery management apparatus, and/or based on previous measured physical quantities of the examined battery during normal operations, for example, 7 and with specific corresponding use patterns, for example. The feature distribution model is modeled or taught in advance based on such distribution information of the example normal feature data. Based on the feature distribution model, a normal area, for example, a normal range can be defined. For example, the feature distribution model may learn an area or range of operation of the same normal battery used for the unbalance feature model, for example, thereby being able more likely recognize or retrieve the area or range of operation from the calculated feature information. Performance for each of a plurality of normal batteries may be substantially the same. Thus, the corresponding normal battery data may also be substantially the same, e.g., with the balance data having zero values or values approximating to zero in general, i.e., with deviations between batteries being minimized during normal operation. Thus, the normal feature data may be located on an origin of the feature space or distributed close to the origin. Accordingly, with this example, the normal area or range is, for example, an area or range surrounding the origin of the feature space. Also, when the feature distribution model is modeled, a threshold used to determine whether a battery state is a normal state or an abnormal state may be determined and set. For example, the threshold may be set based on a determined or selected boundary of the normal area.

In one or more embodiments, the feature distribution model is trained through machine learning. As only examples, the machine learning may include, for example, a deep learning, a support vector machine (SVM), a hidden Markov model, a regression, a neural network, a naive Bayes classification, and a decision tree.

In one or more embodiments, the battery management apparatus may digitize a degree to which current calculated feature data is similar to the feature distribution model, which may be representative of the degree of battery safety.

For example, the battery management apparatus may calculate probability data corresponding to the distribution information of the feature data based on probability distribution information corresponding to the normal area. The battery management apparatus may calculate the probability data corresponding to the distribution information of the feature data based on a distribution and an average of pre-calculated balancing data, which can be compared to a probability threshold in operation 260. In another example, the battery management apparatus may calculate a distance between the feature data and the normal area, which can be compared to a distance threshold in operation 260. With the distance calculation, the battery management apparatus may set a reference point of the normal area, and calculate a distance between the reference point and the feature data. For example, in an embodiment the reference point of the normal area is an origin of the normal area and a point at which a largest number of items of normal feature data are distributed. Here, the battery management apparatus may calculate a Euclidean distance and/or a Mahalanobis distance, as only examples.

Thus, in operation 260, the battery management apparatus compares the determined battery safety, or degree of safety, to a threshold. Here, the threshold may be the aforementioned threshold that may be set when the feature distribution model was modeled, for example. When the calculated probability data is considered to be the indication of the safety of the battery, and if the indicated battery safety is determined to not meet, e.g., is less than, the probability threshold, the battery management apparatus is configured to generate a control signal to output a feedback or control a feedback output device in operation 270. Here, when the indicated battery safety fails to meet the probability threshold, this may indicate that the battery state is an abnormal state. In this example, an output feedback may be one of a visual feedback, an auditory feedback, and a sensible feedback, or any combination thereof, for example. In contrast to such a consideration of the probability data, when a determined distance between the reference point and the feature data is considered to be the indication of the safety of the battery, and if the indicated battery safety meets, e.g., exceeds, a set distance threshold, the battery management apparatus generates the control signal to output the feedback. Here, when the distance between the reference point of the normal area and a distribution position of the feature data is determined to meet such a distance threshold, the battery management apparatus generates the control signal to output the feedback.

Physical quantity information obtained from a battery pack including a plurality of batteries includes changing or varying physical quantities due to an internal state of a battery and changing physical quantities based on changes in current due to the existing use of the battery, e.g., compared to when the battery is not in use. Since such changes in current may be equally applied to the battery pack, e.g., when plural battery modules are connected to one another in series, an influence from the change in current can be offset when the unbalance data is calculated based on a difference in physical quantity of the plurality of batteries, as that difference information based on an internal state of each of the batteries remains in the resultant unbalance data. Thus, the battery management apparatus may determine whether the battery is in an abnormal state irrespective of the change in current and/or the change in voltage due to the use of the battery. Additionally, since the battery management apparatus determines whether the battery is in an abnormal state based on the feature data extracted from the unbalance data, a calculation speed of the battery management method may be much faster than that of a method of determining whether the battery is in the abnormal state using each and all of the sensed physical quantities. Also, in one or more embodiments, when the battery management apparatus determines whether the battery is in an abnormal state at preset time intervals and determines whether the battery is in the abnormal state under a situation in which the physical quantities vary dynamically, there may be a greater reliability on the sensing of whether one or more batteries are in the abnormal state.

Figure 3:
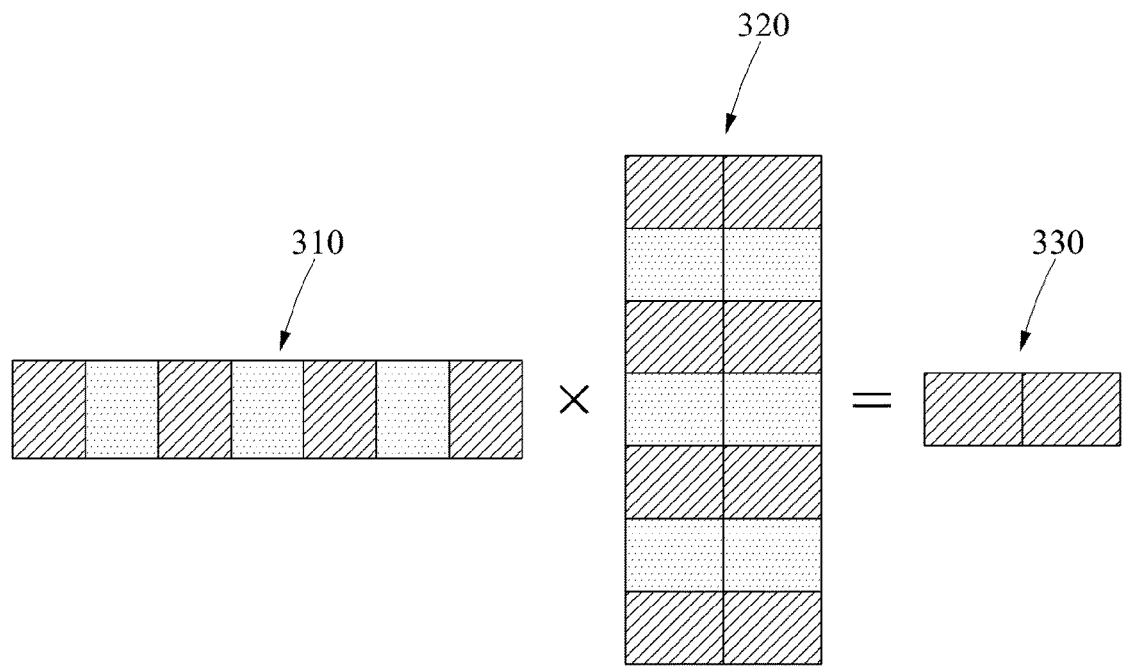
FIG. 3 illustrates an example of a feature extraction model.

FIG. 3 illustrates a feature extraction model, according to one or more embodiments.

Referring to FIG. 3, a battery management apparatus acquires or extracts feature data 330 by projecting unbalance data 310 to a feature space. Here, the battery management apparatus projects the unbalance data 310 to the feature space using a feature extraction model 320.

The feature extraction model 320 is a model defined in advance, as discussed above. For example, normal physical quantities dynamically varying based on charging and/or discharging of a plurality of normal batteries, for example, voltages, currents, and/or temperatures of the plurality of normal batteries, may have been sensed or simulated and recorded as training data, and corresponding normal physical quantity difference information may be calculated based on the normal physical quantities. The normal batteries may be the underlying batteries being examined based on previous physical quantity or physical quantity difference information calculated when the batteries were known to be operating normally without abnormality, for example. The normal physical quantity difference information may be calculated based on a same method as applied to one of the first voltage difference information through the fourth voltage difference information described above with regard to FIG. 2. Balance data is derived based on the normal physical quantity difference information. Here, normal feature data may be derived by applying a dimension reduction function to the balance data. In an embodiment, the dimension reduction function includes a feature extraction function, for example, a principle component analysis (PCA), and a linear discriminant analysis (LDA). When the dimension reduction function is applied to the balance data, a dimension of the balance data may be reduced and normal feature data indicating a feature of the balance data derived. The balance data is thereby mapped to the normal feature data. In this example, information used for the mapping is modeled, thereby generating the feature extraction model 320. The feature extraction model 320 may be previously stored in the battery management apparatus, for example, and used then to extract current feature data.

As illustrated in FIG. 3, a dimension of the unbalance data may be d, a dimension of the feature extraction model 320 may be d×p, resulting in a dimension of the feature data 330 being p. The unbalance data 310 having a high dimension is thus converted into the feature data 330 having a low dimension. The battery management apparatus uses the feature data 330 to detect an abnormal state of the battery pack including the plurality of batteries. Through this reduction in dimension, a speed of calculation performed to detect the abnormal state is increased, as the battery abnormality is determined based on a portion or reduced dimension of the data rather that all of the data or each particular point of data. Thus, the effect of noise, e.g., caused by battery internal resistances, sensor error(s), and data loss that may exist in the unbalance data or the collected physical quantities having the original higher dimension, may be diminished when the battery management method is performed in this manner. Similarly, a battery management apparatus that implements the same may be robust against noise.

Figure 4A:
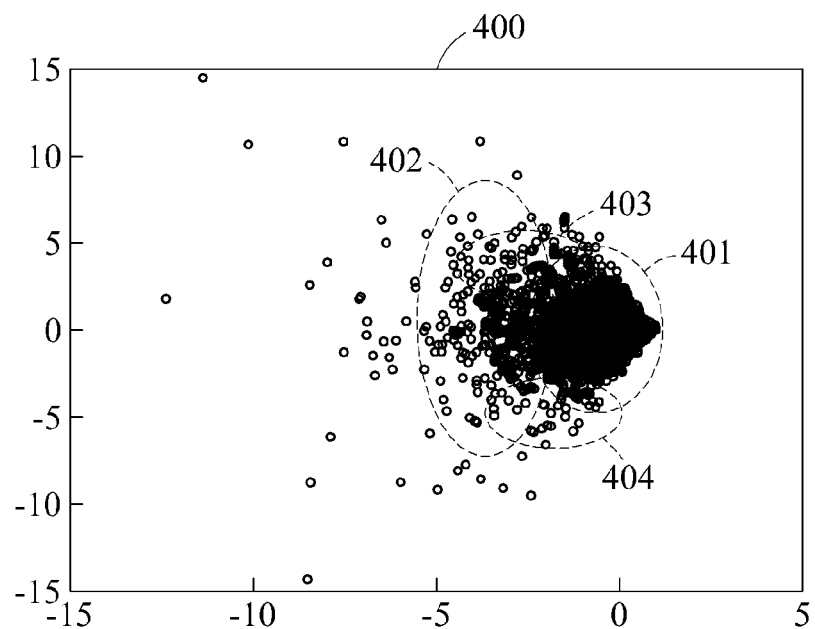
FIGS. 4A and 4B illustrate examples of normal feature data.
Figure 4B:
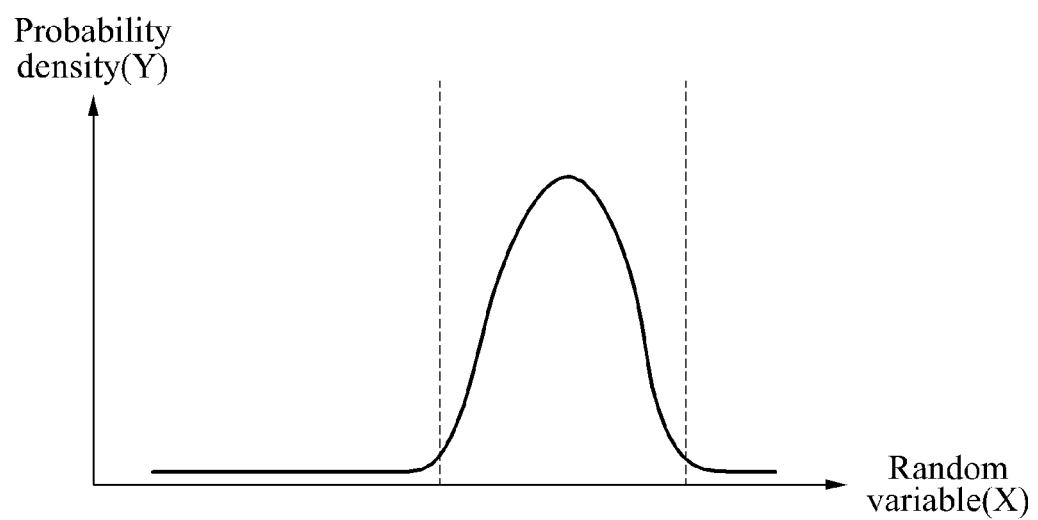

FIGS. 4A and 4B illustrate examples of normal feature data, according to one or more embodiments.

Referring to FIG. 4A, the normal feature data is distributed in a feature space 400.

In response to definitions or selections of normal areas 401 through 404, a battery management apparatus may thus determine whether calculated feature data is distributed or located in the normal areas 401 through 404, and estimate a corresponding battery's safety.

FIG. 4B illustrates probability distribution information. In the graph of FIG. 4B, the x axis represents a random variation corresponding to normal feature data, and the y axis represents a probability density. In the graph, the area indicated by the illustrated dashed lines corresponds to the normal areas 401 through 404. In response to a generation of a corresponding feature distribution model, a distribution and an average of the normal feature data may be calculated, and probability distribution information also calculated. In this example, the normal feature data is located on an origin of the feature space or distributed close to the origin in general and thus, the probability density of the origin or the vicinity of the origin is relatively high.

Figure 5:
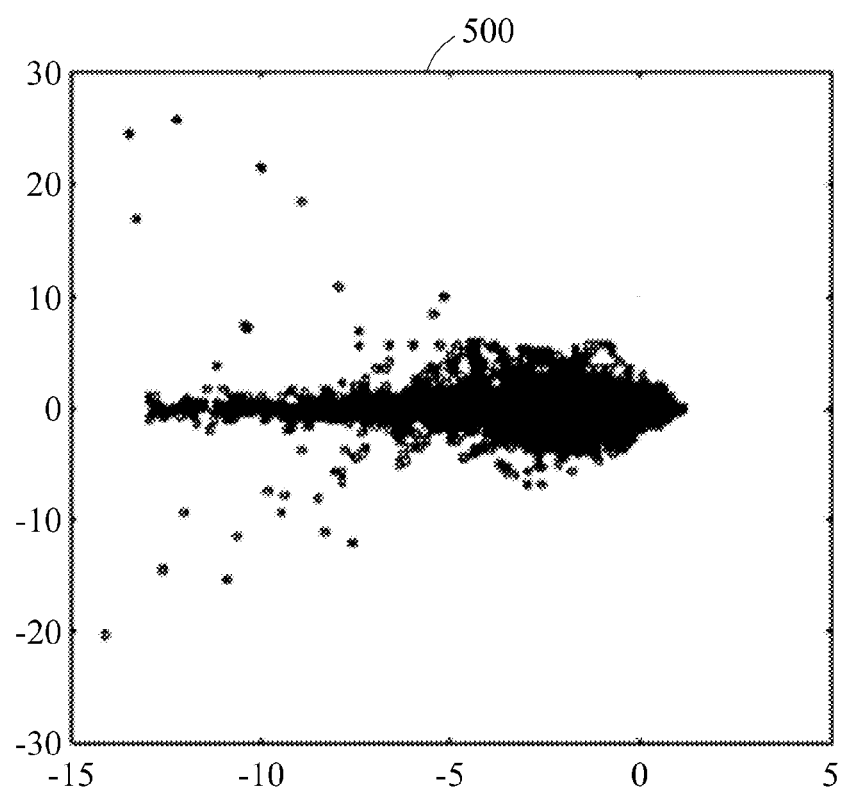
FIG. 5 illustrates an example of feature data.

FIG. 5 illustrates an example of example feature data, according to one or more embodiments.

When compared to the distribution of the normal feature data of FIG. 4A, it can be seen that more items of feature data from the unbalanced data are distributed in the illustrated leftward direction relative to an origin of a feature space 500. Here, when the feature data is distributed in an area other than the normal area, the battery management apparatus may determine that an abnormality occurs in the corresponding battery.

Figure 6:
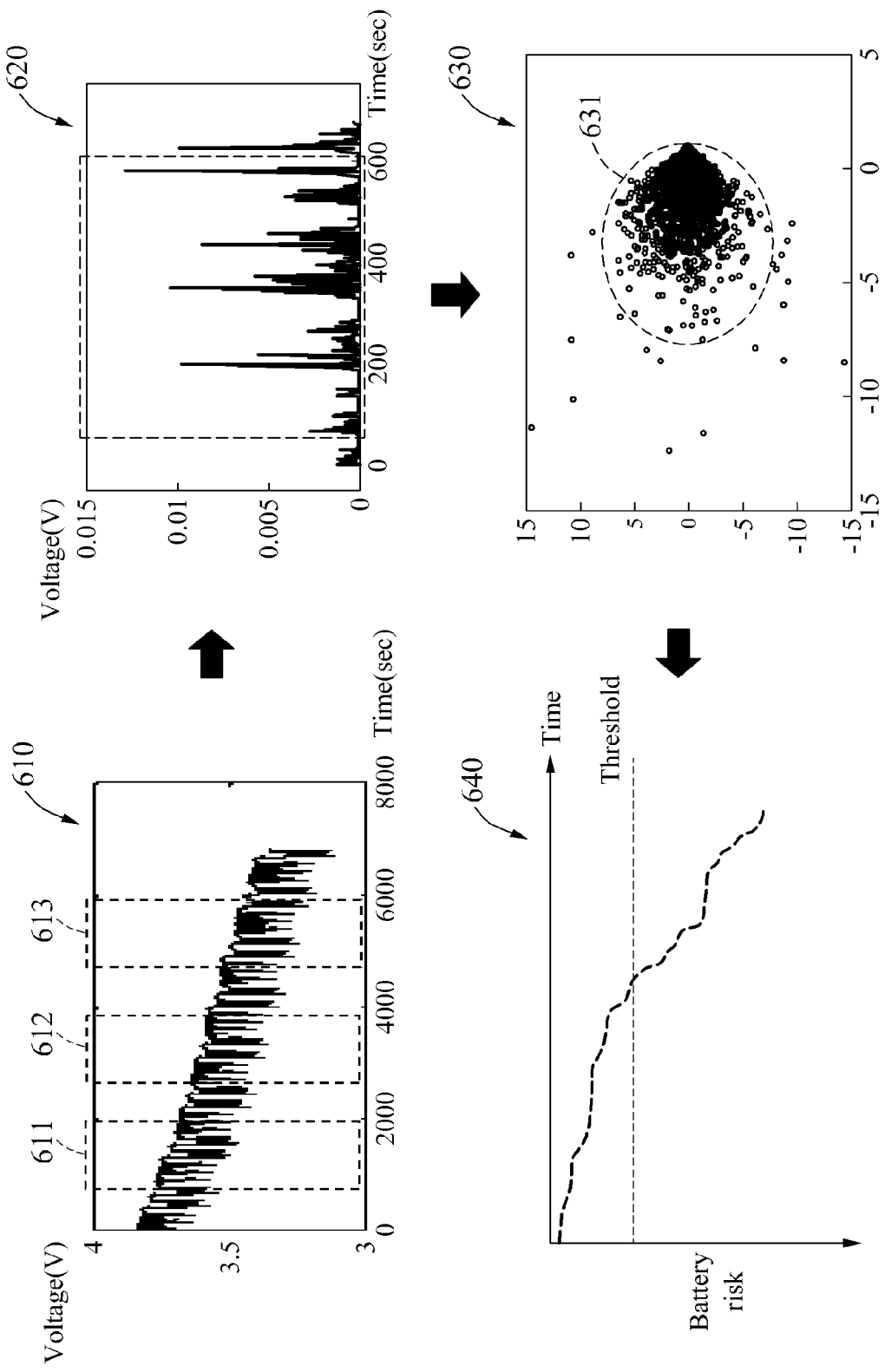
FIG. 6 demonstrates an example method of estimating a battery safety.

FIG. 6 demonstrates a method of estimating a battery safety, according to one or more embodiments.

FIG. 6 illustrates a first graph 610, a second graph 620, a third graph 630, and a fourth graph 640.

The first graph 610 represents a voltage data of a first battery, i.e., a graph of the voltage physical quantities over time. In an example, a battery management apparatus calculates an average $V_{average}$, based on voltage data V of another battery and voltage data $V_1$ of the first battery corresponding to a time t for a time window 611, and derives unbalance data based on, for example, $V_1 - V_{average}$. The battery management apparatus may derive the unbalance data at preset time intervals during the period of time represented by the time window 611. As an example, when a length of the time window is 100 seconds and the unbalance data is derived at intervals of one second, the battery management apparatus derives 100 items of unbalance data. The battery management apparatus derives an unbalance data set corresponding to the time window 611. Similarly, the battery management apparatus derives respective unbalance data sets corresponding to time windows 612 and 613, respectively.

The second graph 620 represents the unbalance data set corresponding to the time window 611. The battery management apparatus inputs the unbalance data set to a feature extraction model and acquires feature data. For example, the battery management apparatus extracts the feature data from the unbalance data set.

The third graph 630 represents a feature space in which a normal area 631 is set. The normal area 631 is an area defined or set before the unbalance data set is derived. Also, a boundary of the normal area 631 may correspond to a threshold that can be compared with extracted unbalance feature data to determine the battery safety.

The fourth graph 640 represents a battery risk over time. The battery risk is an absolute value of a battery safety and thus, the battery risk may be substantially the same or similar criterion as the battery safety. Depending on the case, the battery management apparatus may apply the battery risk to determine whether a battery is in an abnormal state in lieu of the battery safety. For example, the battery management apparatus estimates the battery risk based on distribution information of the feature data and compares the battery risk to a threshold. When the battery risk fails to meet, e.g., is less than, the threshold, feedback is provided to a user.

Figure 7A:
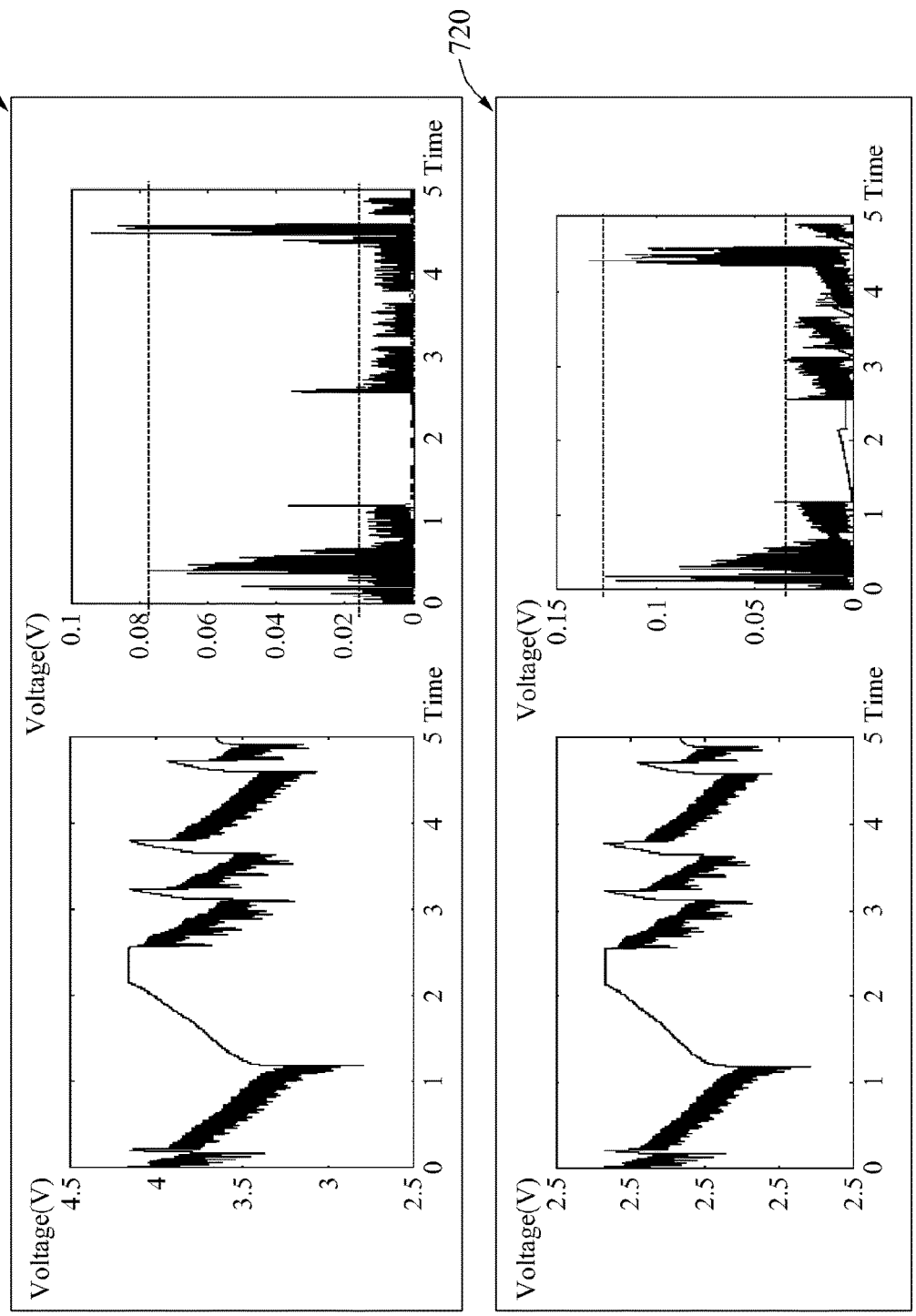

FIGS. 7A through 7C illustrate examples of battery safeties of a first battery and a second battery, according to one or more embodiments. The first battery is a battery in a normal state and the second battery is a battery in an abnormal state.

Referring to FIG. 7A, in the box 710, the illustrated left graph represents voltage data of the first battery and the illustrated right graph represents unbalance data corresponding to the first battery. Also, in the box 720, the illustrated left graph represents voltage data of the second battery and the illustrated right graph represents unbalance data corresponding to the second battery.

As illustrated, the voltage data of the first battery and the second battery vary dynamically. For example, the voltage data of the first battery and the second battery include charging and discharging patterns and user profile patterns. A user profile pattern may indicate, for example, one or more patterns representing how a user of an electric moving body or vehicle drives, such as how fast, slow, intermittent, etc., the user accelerates or brakes, for example.

FIG. 7B illustrates a battery safety estimated based on the voltage data of the first battery and the second battery. FIG. 7C illustrates the battery safety based on the unbalance data of the first battery and the second battery. Although FIGS. 7B and 7C illustrate the battery risk, the battery risk may be based on substantially the same or similar criterion as the battery safety as described above.

Referring to FIG. 7B, feature data corresponding to the voltage data of each of the first battery and the second battery is distributed in the feature space 730. Since the user profile patterns and the charging and discharging pattern of the first battery and the second battery are not removed, the feature data of the first battery and the feature data of the second battery are distributed in the feature space 730 in a state in which the feature data of the first battery and the feature data of the second battery may not be distinguishable from each other.

Similarly, the graph 740 represents the battery risk of the first battery and the battery risk of the second battery. In the graph 740, the battery risk of the first battery is indicated by a solid curve and the battery risk of the second battery is indicated by a dashed curve. Again, it is difficult to distinguish between the battery risks of the first battery and the second battery. Also, since the battery risks dynamically vary over time, the battery management apparatus may be incapable of accurately determining whether the battery is in an abnormal state without further operations. Without such further operations, it may be difficult to accurately determine whether the second battery is in an abnormal state merely by comparing the battery risks of the second battery to a particular threshold.

Referring to FIG. 7C, the feature data corresponding to the determined unbalance data of each of the first battery and the second battery is distributed in the feature space 750. Based on the x axis, the feature data of the first battery is distributed in an area ranging between −5 and 0 and the feature data of the second battery is distributed in an area ranging between −15 and 0 in general. Thus, it can be observed that the feature data of the second battery is biased leftward relative to the feature data of the first battery. Accordingly, with the feature space 750 of FIG. 7C, feature data of the first battery and the feature data of the second battery are distributed in the feature space 750 in a state in which the feature data of the first battery and the feature data of the second battery are distinguished from each other.

To implement the distribution of the respective feature data in the feature space 750, the battery management apparatus may remove a dynamical change pattern, for example, the user profile pattern, and the charging and discharging pattern of a physical quantity. For example, a plurality of battery modules connected in series in a battery pack have the same current value. Similarly, a plurality of battery cells connected in series in one battery module have the same current value. Thus, a dynamical change in voltage data would occur due to a change in a battery's internal resistance and a change in current based on required power. In response to the change in current, voltage data of the plurality of battery cells may similarly change. For example, the voltage data for each of the battery modules may represent a common dynamical change pattern in response to the change in current. Thus, when a difference in voltage among the plurality of battery modules is calculated, the common dynamical change pattern may be removed for multiple battery modules or battery cells connected in series. The difference in voltage may be irrespective of the change in current and proportional to a difference in internal resistance among the plurality of battery modules.

With the dynamical change patterns of physical quantities of the first battery and the second battery being removed from the unbalance data of the first battery and the second battery, e.g., through use of the feature extraction model, the feature data of the first battery and the feature data of the second battery are distributed in feature space 750 in a state in which the feature data of the first battery and the feature data of the second battery can be distinguished from each other.

The graph 760 of FIG. 7C represents the corresponding battery risk of the first battery and the battery risk of the second battery. The battery risk of the first battery aligns with the illustrated area 761 and the battery risk of the second battery aligns with the illustrated area 762. Accordingly, as the first battery is a normally operating battery, area 761 corresponds to a known or modeled normal area while the area 762 represents an abnormal area. Thus, the battery risk of the first battery and the battery risk of the second battery may be classified based on a corresponding threshold. Therefore, based on feature data extracted from unbalance data, the battery management apparatus may accurately determine whether a battery is in an abnormal state.

Figure 8:
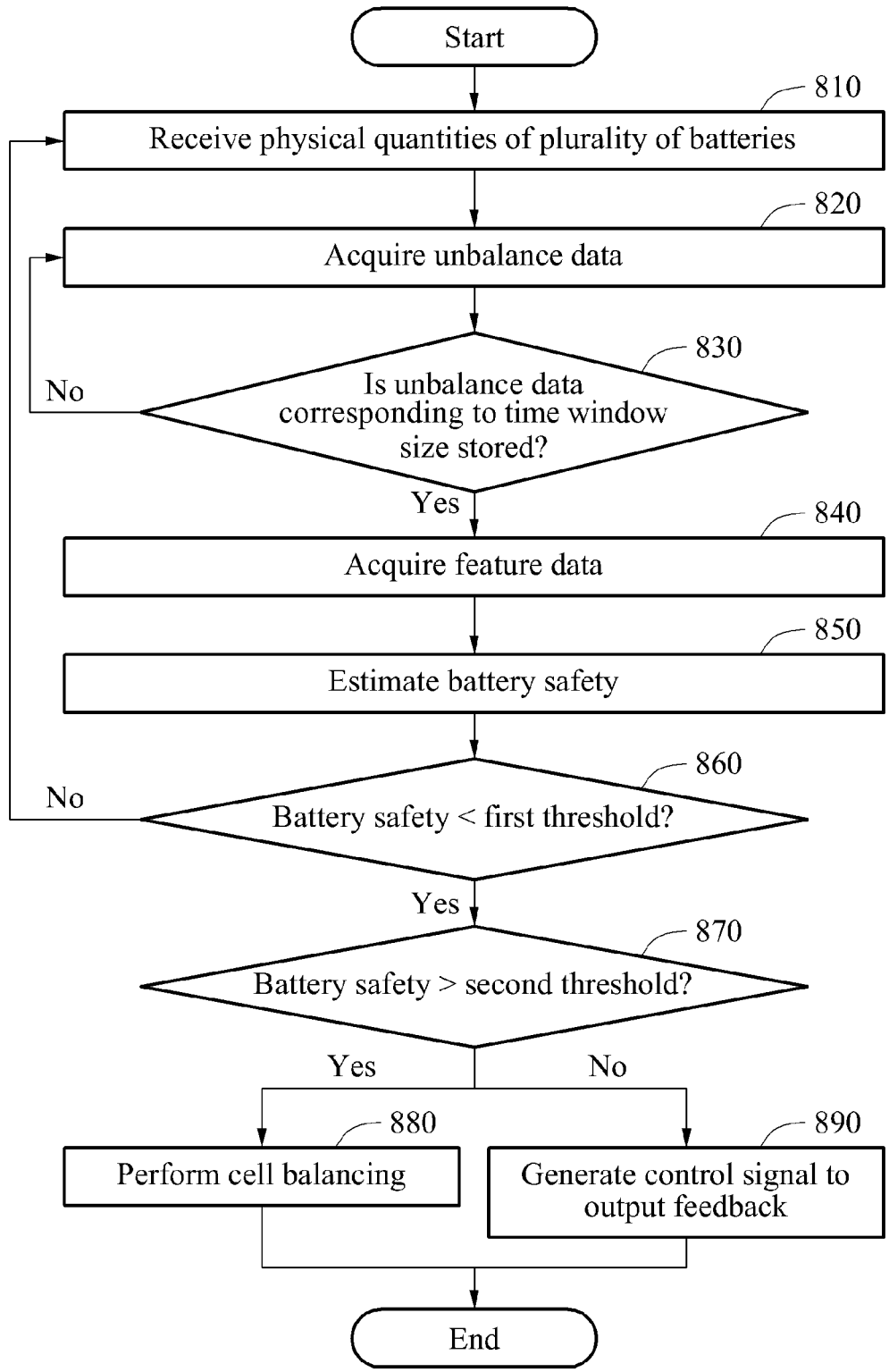
FIG. 8 illustrates an example of a battery management method.

FIG. 8 illustrates a battery management method, according to one or more embodiments.

The battery management method of FIG. 8 may be performed by a battery management apparatus, such as any of the above or below discussed battery management apparatuses, noting that embodiments are not limited thereto. Since the descriptions provided with reference to operations 210 through 250 of FIG. 2 are also respectively applicable here, repeated descriptions with respect to operations 810 through 850 of FIG. 8 will be omitted as appropriate.

Further to the discussion of above with regard to operation 250 of FIG. 2, in operation 860, the battery management apparatus determines whether a battery safety fails to meet, e.g., is less than, a first threshold. When the battery safety is determined to not meet the first threshold, the battery management apparatus determines whether the battery safety meets, e.g., is greater than, a second threshold in operation 870. When the battery safety is determined to meet the second threshold, the battery management apparatus performs cell balancing in operation 880. Also, when the battery safety is determined to not meet, e.g., is less than or equal to, the second threshold, the battery management apparatus generates a control signal to output a feedback in operation 890. Here, in one or more embodiments, when the battery safety is determined to not meet the second threshold the battery management apparatus may also perform the cell balancing.

Figure 9:
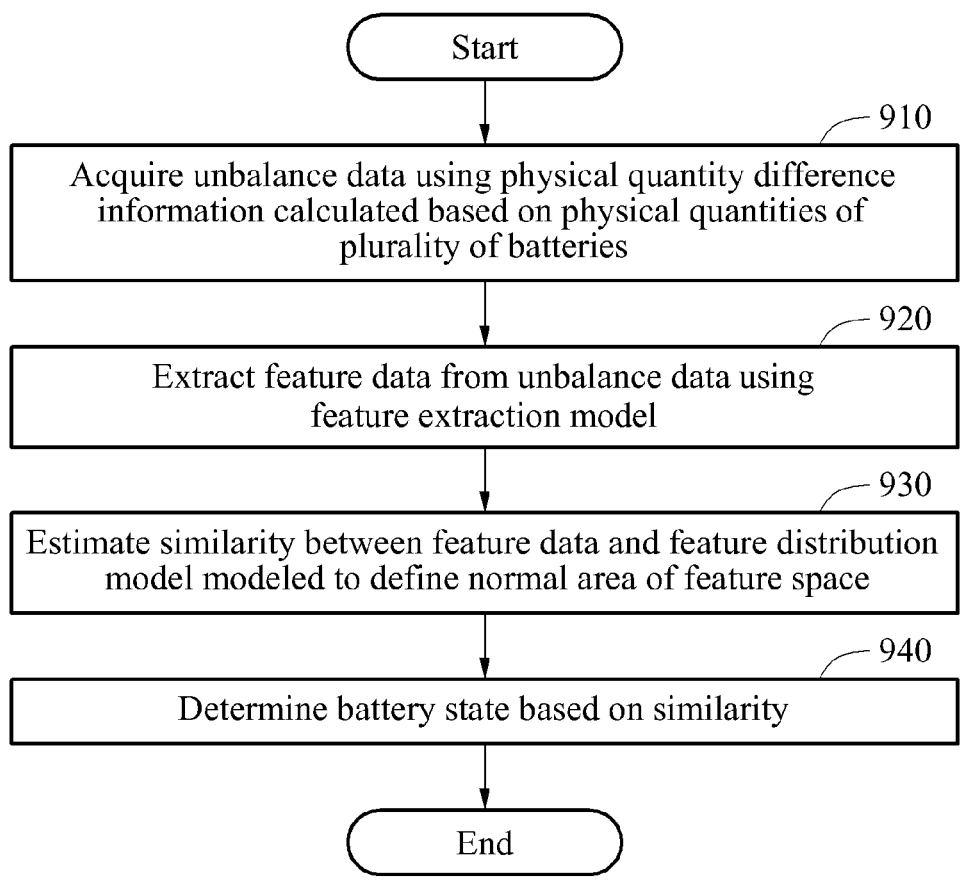
FIG. 9 illustrates an example of a battery management method.

FIG. 9 illustrates a battery management method, according to one or more embodiments.

The battery management method of FIG. 9 may be performed by a battery management apparatus, such as any of the above or below discussed battery management apparatuses, noting that embodiments are not limited thereto.

In operation 910, the battery management apparatus derives unbalance data using physical quantity difference information calculated based on first physical quantities of a plurality of batteries. For example, the battery management apparatus derives an amount of the unbalance data based on physical quantity difference information having a quantity corresponding to t time window size, and stores the unbalance data in a buffer having a size corresponding to the time window size.

In an example, the battery management apparatus calculates second physical quantity difference information based on second physical quantities having physical properties differing from the physical properties of the first physical quantities, and derives the unbalance data by additionally applying the second physical quantity difference information.

In operation 920, the battery management apparatus extracts feature data from the unbalance data using a feature extraction model. The feature extraction model is, for example, a model previously defined to extract a feature of balance data derived based on difference information of normal battery data.

In operation 930, the battery management apparatus estimates a similarity between the extracted feature data and a feature distribution model modeled to define a normal area of a feature space in which the extracted feature data is distributed. The feature distribution model is generated based on distribution information of the normal feature data corresponding to a feature extracted using the feature extraction model. When an abnormality is not found in a battery operation, the similarity is relatively high. Conversely, when an abnormality is detected in the battery operation, the similarity is relatively low. The battery management apparatus calculates a value corresponding to the similarity, such as a degree or percentage of similarity, to estimate the similarity.

In operation 940, the battery management apparatus determines a battery state based on the estimated similarity. The battery state is, for example, one of a normal state and an abnormal state. The battery management apparatus compares the estimated similarity to a threshold to determine the battery state. As an example, the battery management apparatus calculates probability data corresponding to distribution information of the extracted feature data based on probability distribution information of the normal feature data. The battery management apparatus compares the probability data to a probability threshold. When the probability data fails to meet, e.g., is less than, the probability threshold, the battery management apparatus determines that the battery is in the abnormal state. As another example, the battery management apparatus calculates a distance between a reference point of the normal area and a distribution position corresponding to distribution information of the extracted feature data. The battery management apparatus compares the distance to a distance threshold. When the distance meets, e.g., is greater than, the distance threshold, the battery management apparatus determines that the battery is in the abnormal state. Here, the battery management apparatus may perform only one of the probability or distance comparisons, or both.

In an example, the method of FIG. 9 may further include operations similar to operations 860-890 of FIG. 8. For example, when the probability data fails to meet a first threshold, there may be an additional consideration of whether the probability at least meets a second threshold, in which case the battery management apparatus determines that cell balancing is to be performed. Likewise, when the distance meets a first threshold but fails to meet a second threshold, the battery management apparatus may determine that cell balancing is to be performed.

Figure 10:
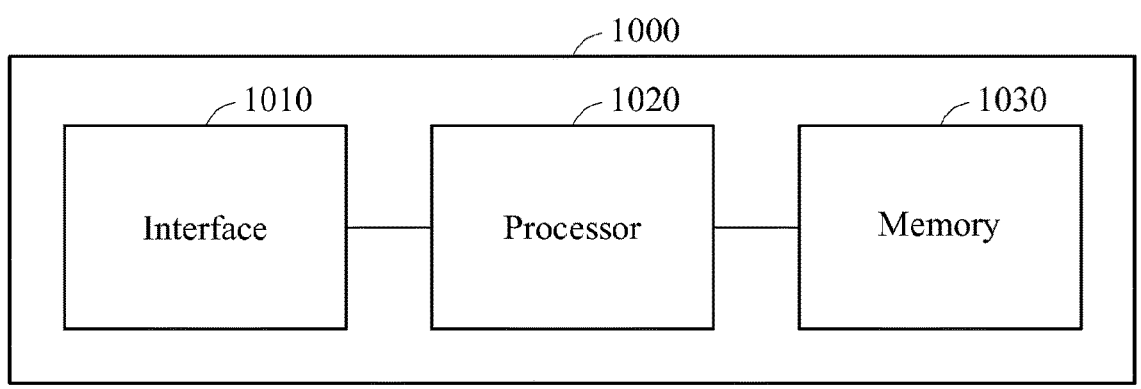
FIG. 10 illustrates an example of a battery management apparatus.

FIG. 10 illustrates a battery management apparatus, according to one or more embodiments.

Referring to FIG. 10, an example battery management apparatus 1000 includes an interface 1010, a processor 1020, and a memory 1030, for example.

One or more sensors collect physical quantities of a plurality of batteries, and transfer the collected physical quantities to the interface 1010, and the interface 1010 receives and stores the plurality of physical quantities in a memory included in the interface 1010. The physical quantities vary dynamically. Alternatively, in a battery management system embodiment the one more sensors may be considered included in or part of the system of the interface 1010.

The processor 1020 is configured to derive unbalance data through determinations of physical quantity difference information that the processor 1020 is configured to calculate based on the physical quantities. Also, the processor 1020 is configured to acquire or extract feature data from the unbalance data by projecting the unbalance data to a feature space, e.g., based on a feature extraction model, and configured to estimate a battery safety for a corresponding battery based on distribution information of the feature data, e.g., using a feature distribution model. The processor 1020 represents one or more processing devices.

In an embodiment, the memory 1030 stores the feature extraction model used to extract the feature data and the feature distribution model used to estimate the battery safety.

Accordingly, in one or more embodiments, the processor 1020 is configured to implement any one, combination, or all of the battery management methods described herein with reference to FIGS. 1 through 9, for example. Accordingly, the processor 1020 implements the battery management method with reference to the memory 1030 using the feature extraction model and the feature distribution model. In addition, in one or more embodiments, the memory may represent one or more memories, with at least one of the memories storing processor readable code to control the processor 1020 to implement any or any combination of such methods of FIGS. 1-9, as discussed above.

Figure 11:
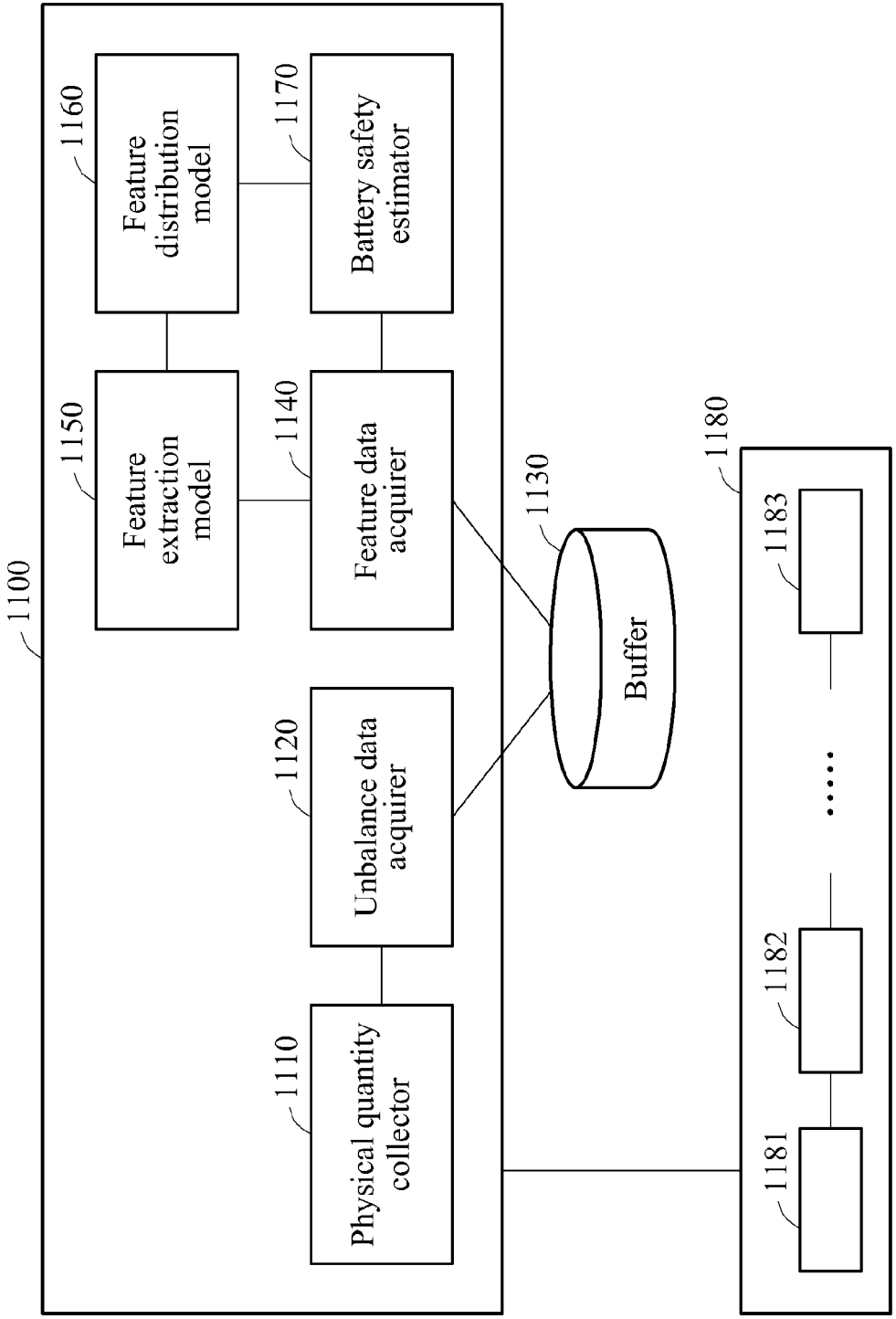
FIG. 11 illustrates an example of a battery management apparatus.

FIG. 11 illustrates a battery management apparatus, according to one or more embodiments.

An example battery management apparatus 1100 includes a physical quantity collector 1110, an unbalance data acquirer 1120, a feature data acquirer 1140, a feature extraction model 1150, a feature distribution model 1160, and a battery safety estimator 1170, for example. Here, any or any combination of the physical quantity collector 1110, the unbalance data acquirer 1120, the feature data acquirer 1140, the feature extraction model 1150, the feature distribution model 1160, and the battery safety estimator 1170 may be implemented by one or more processing devices. Each of the physical quantity collector 1110, the unbalance data acquirer 1120, the feature data acquirer 1140, the feature extraction model 1150, the feature distribution model 1160, and the battery safety estimator 1170 may be implemented by other hardware components specifically configured to implement the same as described below. For example, in one or more embodiments, the unbalance data acquirer 1120, the feature data acquirer 1140, and the battery safety estimator 1170 are implemented by processing device(s) as described above with regard to FIG. 2 or 10, for example, and may implement any or any combination of operations described above with regard to FIGS. 1-10. The feature extraction model 1150 and the feature distribution model 1160 are stored in a memory of the battery management apparatus 1100, similar to the memory 1030 of FIG. 10.

The physical quantity collector 1110 is configured to receive sensor information or measurements for a physical quantity of a battery 1180. The battery 1180 includes a plurality of battery modules 1181 through 1183. Depending on embodiment, respective sensors configured to sense the physical quantity for each of the plurality of battery modules 1181 through 1183 are disposed internally or externally to the battery 1180. Alternatively, a single sensor may be connected to the plurality of battery modules 1181 through 1183 to sense the physical quantity of each of the plurality of battery modules 1181 through 1183. Also, sensors corresponding to the plurality of battery modules 1181 through 1183 are configured to sense different physical quantities of the battery modules 1181 through 1183, or different sensors for different physical quantities may be arranged with respect to the battery modules 1181 through 1183. The sensor(s) are configured to transfer the physical quantities to the physical quantity collector 1110.

The physical quantity collector 1110 receives a physical quantity of at least one battery cell included in each of the plurality of battery modules 1181 through 1183. For example, in an embodiment, each of the plurality of battery modules 1181 through 1183 includes a cell monitor. The cell monitor senses the physical quantity of the at least one battery cell and transfers the sensed physical quantity to the physical quantity collector 1110. The measurements of the physical quantity may be transferred to the physical quantity collector 1110 immediately or delayed to be transferred in set batches, and such measurements may be performed at set intervals, for example. Such intervals or other characteristics of the measurements of the physical quantity may differ depending on which physical quantity the particular sensor is measuring. In an embodiment the physical quantity collector 1110 includes a memory to buffer or collect multiple measurements of the physical quantity from the battery modules 1181 through 1183, which may be collected for a particular set window of time, until a capacity of the memory is to be reached, or based on other considerations.

Since the descriptions provided with reference to FIGS. 1 through 10 are also applicable here, repeated further descriptions with respect to FIG. 11 will be omitted for increased clarity and conciseness.

Figure 12:
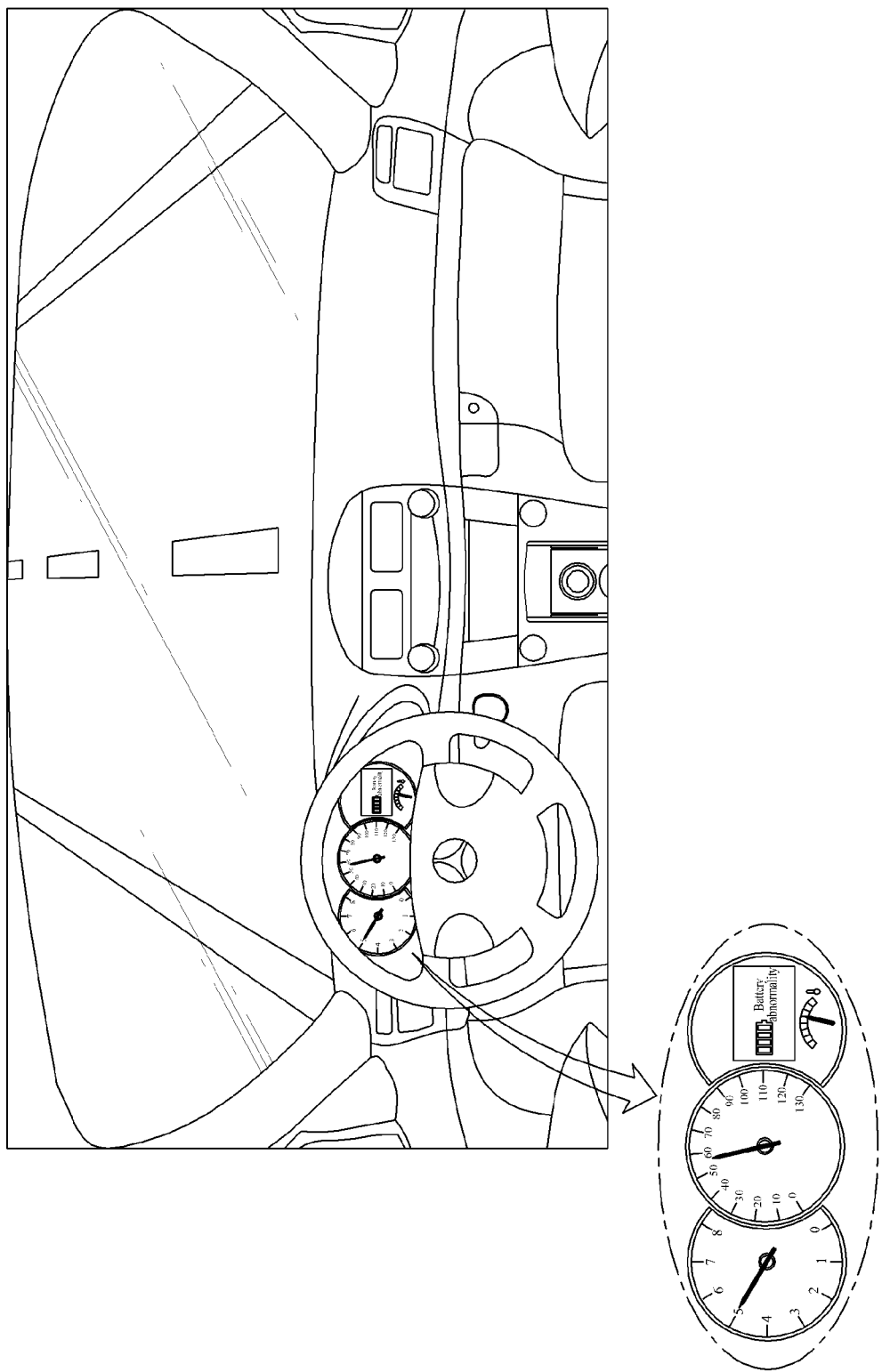
FIG. 12 illustrates an example of a battery management apparatus.

FIG. 12 illustrates a battery management apparatus, according to one or more embodiments.

An example battery management apparatus according to one or more embodiments is included in a physical application such as an electric moving or driven body or vehicle, and, depending on embodiment, may further be the electric moving or driven body or vehicle system or another electronic device embodiment. The battery management apparatus or system is configured to determine whether a battery module or a battery pack included in the system or electronic device, for example, is in an abnormal state. The physical application may further include other electronic devices, including mobile devices, such as mobile phones, personal data assistants, laptops, tablet computers, or wearable devices, as only examples and depending on embodiment.

As illustrated in FIG. 12, in an example where the physical application is an electric vehicle, while the electric vehicle is traveling and one or more batteries are being used, such as through discharging or charging of one or more of the batteries, and resulting in dynamically varying physical quantity data, the battery management apparatus calculates physical quantity difference information based on a measured physical quantity of a battery cell or a battery module of the electric vehicle, or based on different physical quantity data for the battery cell or battery module, and derives unbalance data based on the physical quantity difference information. When the electric vehicle is using the battery cell or battery module while moving, the measured physical quantity data may represent a traveling pattern of the electric vehicle. As described in the example of FIG. 7A, the physical quantity transferred during the traveling may include a charging and/or discharging pattern and a user profile pattern. When feature data is acquired based on measured physical quantity that represents such a traveling pattern, accuracy in determining a corresponding battery state may decrease without additional operations being implemented to help remove or diminish such patterns. Thus, the battery management apparatus calculates the physical quantity difference information based on the physical quantity representing the traveling pattern, derives unbalance data based on the physical quantity difference information, and determines a battery state based on feature data extracted from the unbalance data, e.g., where the extraction of the feature data relies upon a feature extraction model. The feature extraction model may be taught based on a normal operation of ideal battery operations, simulated normal battery operation, or normal battery operation of the underlying battery that is being evaluated, in which case the feature extraction model may further take into consideration particular traveling patterns of the driver.

The aforementioned physical application is described as an example and thus, a type of physical application is not limited thereto. The battery management apparatus is applicable to any type of physical application using a battery as well as the electric moving body. As noted above, a battery management apparatus according to one or more embodiments may be included in or include various types of physical applications, for example, a laptop computer, a tablet computer, a smartphone, and a wearable device, noting that alternatives are also available.

With the electric vehicle embodiment, when the battery is determined to be in an abnormal state, the battery management apparatus generates a control signal to control the electric vehicle to display a visual feedback on a dashboard or another visual devise, such as a radio or interaction system of the vehicle, and the control signal or another control signal may control the vehicle to also, or alternatively, provide an auditory feedback to the driver to warn about the battery abnormality.

Accordingly, the battery management apparatus determines whether the battery is in the abnormal state while the battery of the electric vehicle is in use, such as when the vehicle is being operated. Through this, the battery management apparatus may reduce a risk of accident due to an abnormality in the battery and thus, may increase reliability on detecting abnormalities in batteries of electric vehicles.

In such an electric vehicle example, the battery management apparatus may also be implemented in a form of a chip and included in an electric control unit (ECU) of the electric vehicle, which may represent any vehicle that is at least partially driven based on such battery power. Alternatively, the battery management apparatus may be implemented in a form of a physical board or a hardware unit configured to communicate with the ECU. The battery management apparatus may be, or included in, a high-capacity battery management system, for example, an electric vehicle, a hybrid vehicle, and an energy storage system (ESS). The battery management apparatus may be, or included in, an electronic device including a rechargeable battery or an electronic device management system, noting that further alternatives are also available.

The apparatuses, units, modules, devices, and other components illustrated in any or all FIGS. 10-12, or a collection of the same, that perform the operations described herein with respect to any of FIGS. 2-12 are hardware components. Examples of hardware components include controllers, sensors, generators, drivers, and any other electronic components known to one of ordinary skill in the art. In one or more embodiments, the hardware components are one or more processing devices, such as processors or computers. Such a processing device, processor, or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one or more embodiments, a processing device, processor, or computer includes, or is connected to, one or more memories storing instructions or software that are executed by the processing device, processor, or computer. Hardware components implemented by a processor or computer, for example, are configured to execute instructions or software, such as an operating system (OS) and one or more software applications that run on the OS, to perform the operations described herein. The hardware components also access, manipulate, process, create, and store data in response to execution of the instructions or software. For simplicity, the singular term "processing device", "processor" or "computer" may be used in the description of the examples described herein, but in other examples multiple processing devices, processors or computers are used, or a processing device, processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processing device, processor or computer to implement operations of the hardware components and perform any or all of the methods as described above as only examples, are written as processor or computer readable programs, code segments, instructions or any combination thereof, for individually or collectively instructing or configuring the processing device, processor or computer to operate as a machine or special-purpose computer to perform the operations performed by the hardware components and the methods as described above. In one example, the instructions or software include machine code that is directly executed by the processing device, processor or computer, such as machine code produced by a compiler. In another example, the instructions or software include higher-level code that is executed by the processing device, processor or computer using an interpreter. After a full understanding of the present disclosure, programmers of ordinary skill in the art may readily write such instructions or software based on the block diagrams and the flow charts illustrated in the drawings and the corresponding descriptions in the specification, which disclose algorithms for performing the operations performed by the hardware components and the methods as described above.

The instructions or software to control a processing device, processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner for providing the instructions or software and any associated data, data files, and data structures to a processor or computer so that the processing device, processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processing device, processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management method comprising:
   acquiring physical quantity data indicating a sensed physical quantity for each of a plurality of batteries;
   determining, based on the sensed physical quantities, any one of an average, a minimum, and a maximum value of the sensed physical quantities;
   determining a physical quantity difference information by determining a difference between each of the sensed physical quantities and the any one of the determined average, the determined minimum, and the determined maximum value of the sensed physical quantities;
   calculating unbalance data based on the physical quantity difference information;
   obtaining corresponding data of the unbalance data by performing a dimensionality reduction of the unbalance data to project the unbalance data to a predetermined space;
   determining distribution information indicating a distribution of the corresponding data in the predetermined space; and
   determining a battery safety for one or more of the plurality of batteries based on the distribution information of the corresponding data.

2. The battery management method of claim 1, wherein the determining of the battery safety includes selectively indicating the battery safety to a user based on the determined distribution information.

3. The battery management method of claim 1, wherein the method is performed by an electronic device apparatus, the method further comprising:
   comparing the determined battery safety to one or more thresholds; and
   performing, based on a result of the comparing, one or more of alerting a user of the electronic device apparatus that a battery is in an abnormality state and rebalancing the plurality batteries.

4. The battery management method of claim 3, wherein the predetermined space is based on a predetermined feature extraction model of balance data representing physical quantity difference information of physical quantity data of a battery being used when corresponding physical quantities dynamically vary without abnormality, and the distribution information of the corresponding data is determined based on a predetermined distribution modeling of the balance data for battery risk or battery safety over time.

5. The battery management method of claim 4, wherein the electronic device apparatus is an electric or hybrid-electric vehicle.

6. The battery management method of claim 1, wherein the determining of the battery safety comprises determining whether a distribution of the corresponding data is within a predetermined area.

7. The battery management method of claim 6, wherein the area is an area set using determined distribution information of normal corresponding data corresponding to balance data that is based on difference information of normal battery data.

8. The battery management method of claim 7, wherein the area is an area of the predetermined space that is set based on a projection of the balance data into a predetermined space that results in the normal corresponding data.

9. The battery management method of claim 6, wherein the determining of the battery safety comprises calculating probability data corresponding to the determined distribution data based on probability distribution information of normal corresponding data.

10. The battery management method of claim 1, wherein the determining of the battery safety comprises calculating a distance between a distribution position of the corresponding data in the predetermined space and a reference point of a area in the predetermined space corresponding to distribution of normal battery data.

11. The battery management method of claim 10, wherein the determining of the battery safety further comprises:
    performing a first comparing of the distance to a first threshold and, when a result of the first comparing indicates that the distance meets the first threshold, performing a second comparing of the distance to a second threshold; and
    performing cell balancing in response to the distance being determined to fail to meet the second threshold and generating a control signal to control an output of a feedback to a user in response to the distance being determined to meet the second threshold.

12. The battery management method of claim 1, wherein the obtaining of the corresponding data comprises projecting the unbalance data to the predetermined space using a feature extraction model, where the feature extraction model is a model previously defined so as to extract balance data from input data and is based on difference information of normal battery data.

13. The battery management method of claim 12, wherein the determining of the distribution information comprises determining the distribution information using a feature distribution model that has been previously modeled based on distribution information of normal feature data corresponding to a normal feature extracted using the feature extraction model.

14. The battery management method of claim 1, further comprising:
    comparing the battery safety to a threshold and generating a control signal to control an output of a feedback to a user based on a result of the comparing.

15. The battery management method of claim 1, further comprising:
    performing a first comparing of the battery safety to a first threshold and, when a result of the first comparing indicates that the battery safety fails to meet the first threshold, performing a second comparing of the battery safety to a second threshold; and
    performing cell balancing in response to the battery safety being determined to meet the second threshold and generating a control signal to control an output of a feedback to a user in response to the battery safety being determined to fail to meet the second threshold.

16. The battery management method of claim 1, wherein the calculating of the unbalance data comprises deriving the unbalance data based on the physical quantity difference information having an extent corresponding to a predetermined time window size, and storing the derived unbalance data in a buffer having a capacity corresponding to the predetermined time window size.

17. The battery management method of claim 1, wherein:
    the calculating of the unbalance data comprises deriving the unbalance data from first and second physical quantity difference information, of the physical quantity difference information, respectively calculated based on different first and second physical quantities, of the sensed physical quantities, and the first and second physical quantities representing respective measurements of different physical properties of one or more of the plurality of batteries.

18. The battery management method of claim 1, wherein the physical quantity difference information comprises at least one of:
first difference information indicating respective first differences between the average value of the physical quantities and each of the physical quantities or indicates an average value of the respective first differences;
second difference information indicating a second difference between the maximum value and the minimum value of the physical quantities;
third difference information indicating respective third differences between the maximum value and each of the physical quantities or indicates an average value of the respective third differences; and
fourth difference information indicating respective fourth differences between the minimum value and the each of the physical quantities or indicates an average value of the respective fourth differences.

19. The battery management method of claim 18, wherein the physical quantity difference information comprises at least one of the first difference information, second difference information, third difference information, and fourth difference information, for each of first physical quantities that are voltage measurements and second physical quantities that are temperature measurements.

20. The battery management method of claim 19, further comprising adding normalized values of the unbalance data corresponding to the first physical quantities to normalized values of the unbalance data corresponding to the second physical quantities, to determine an unbalance value for the plurality of batteries.

21. A battery management apparatus comprising:
an interface configured to acquire physical quantity data indicating a sensed physical quantity for each of a plurality of batteries; and
one or more processing devices configured to:
determine, based on the sensed physical quantities, any one of an average, a minimum, and a maximum value of the sensed physical quantities;
determine physical quantity difference information by determining a difference between each of the sensed physical quantities and the any one of the determined average, the determined minimum, and the determined maximum value of the sensed physical quantities,
calculate unbalance data based on the physical quantity difference information,
obtain corresponding data of the unbalance data by performing a dimensionality reduction of the unbalance data to project the unbalance data to a predetermined space,
determine distribution information indicating a distribution of the corresponding data in the predetermined space, and
determine a battery safety for one or more of the plurality of batteries based on the distribution information of the corresponding data.

22. The battery management apparatus of claim 21, further comprising:
the plurality of batteries; and
a plurality of sensors configured to measure the physical quantities from the plurality of batteries when the physical quantities of the plurality of batteries are dynamically varying, and to provide the measured physical quantities to the interface for the acquiring of the physical quantity data.

23. The battery management apparatus of claim 21, wherein the battery management apparatus is an electric control unit (ECU), or in local communication with the ECU, of an electric or hybrid-electric vehicle that includes the plurality of batteries and a plurality of sensors configured to measure the physical quantities from the plurality of batteries when the physical quantities of the plurality of batteries are dynamically varying and to provide the measured physical quantities to the interface for the acquiring of the physical quantity data.

24. A non-transitory processor readable recording medium comprising processor readable code to control one or more processing devices to implement a battery management method, the method including:
acquiring physical quantity data indicating a sensed physical quantity for each of a plurality of batteries;
determining, based on the sensed physical quantities, any one of an average, a minimum, and a maximum value of the sensed physical quantities;
determining physical quantity difference information by determining a difference between each of the sensed physical quantities and the any one of the determined average, the determined minimum, and the determined maximum value of the sensed physical quantities;
calculating unbalance data based on the physical quantity difference information;
obtaining corresponding data of the unbalance data by performing a dimensionality reduction of the unbalance data to project the unbalance data to a predetermined space;
determining distribution information indicating a distribution of the corresponding data in the predetermined space; and
determining a battery safety for one or more of the plurality of batteries based on the distribution information of the corresponding data.

* * * * *